(12) United States Patent
Murakami et al.

(10) Patent No.: US 9,429,681 B2
(45) Date of Patent: Aug. 30, 2016

(54) LIGHT CONVERSION ELEMENT CONTAINING IONIC LIQUID, A PROCESS FOR MAKING SAME, AND AN APPARATUS COMPRISING THE LIGHT CONVERSION ELEMENT

(75) Inventors: Yoichi Murakami, Tokyo (JP); Isao Satoh, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 638 days.

(21) Appl. No.: 13/878,973

(22) PCT Filed: Oct. 12, 2011

(86) PCT No.: PCT/JP2011/073443
§ 371 (c)(1),
(2), (4) Date: Jun. 24, 2013

(87) PCT Pub. No.: WO2012/050137
PCT Pub. Date: Apr. 19, 2012

(65) Prior Publication Data
US 2013/0274090 A1  Oct. 17, 2013

(30) Foreign Application Priority Data

Oct. 13, 2010 (JP) ................. 2010-230938
Feb. 2, 2011 (JP) ................. 2011-021136

(51) Int. Cl.
| | | |
|---|---|---|
| G02B 5/02 | (2006.01) | |
| C07C 1/00 | (2006.01) | |
| G02B 1/04 | (2006.01) | |
| H01G 9/20 | (2006.01) | |
| H01B 1/12 | (2006.01) | |
| B01J 31/22 | (2006.01) | |
| H01L 31/055 | (2014.01) | |

(52) U.S. Cl.
CPC ................ *G02B 1/04* (2013.01); *B01J 31/22* (2013.01); *H01B 1/122* (2013.01); *H01G 9/2013* (2013.01); *H01L 31/055* (2013.01); *Y02E 10/52* (2013.01); *Y02E 10/542* (2013.01); *Y02P 70/521* (2015.11)

(58) Field of Classification Search
CPC ........ G02B 1/04; H01G 9/2013; H01B 1/22; H01L 31/55; B01J 31/22; Y02E 10/52; Y02E 10/542
USPC ...................... 252/582; 204/157.15
See application file for complete search history.

(56) References Cited

U.S. PATENT DOCUMENTS

2005/0056815 A1   3/2005   Miteva et al.

FOREIGN PATENT DOCUMENTS

| | | |
|---|---|---|
| CN | 101608115 A | 12/2009 |
| JP | 4518313 B | 2/2005 |
| JP | 2008-506798 A | 3/2008 |
| JP | 2009-108249 A | 5/2009 |
| WO | 2009/071281 A1 | 6/2009 |

OTHER PUBLICATIONS

Murakami, Photochemical photon upconverters with ionic liquids, Oct. 1, 2011, Chemical Physical Letters, 516, 56-61.*
Ichinose, Nobuyuki et al., "Ion Ekitai Chu ni Okeru Dibenzofuran no Sanjuko-Sanjuko Shometsu ni yori Hoshutsu sareru Chien Keiko no Kansoku," *Symposium on Photochemistry* (Sep. 11, 2008), p. 246.
Petrich, J.W. et al., "Dynamic Solvation in Room Temperature Ionic Liquids," *J. Phys. Chem. B* (2004) 108:10245-10255.
He, Ron et al., "A general strategy for the synthesis of upconversion rare earth fluoride nanocrystals via a novel OA/ionic liquid two-phase system," *Chem. Commun.* (2011) 47:9510-9512.
Bhattacharyya, Kankan, "Marcus-like Inversion in Electron Transfer in Neat Ionic Liquid and Ionic Liquid-Mixed Micelles," *J. Phys. Chem. B* (2011) 115:4680-4688.
Murakami, Yoichi, "Development of High-Efficiency Photon Upconverters and their Mechanism Elucidations," *Dai 48 Kai National Heat Transfer Symposium of Japan Koen Yokoshu*, (Jul. 12, 2011), No. D332.
Murakami, Yoichi, "Photochemical photon upconverters with ionic liquids," *Chemical Physics Letters* (2011) 516:56-61.
Baluschev, S. et al., "Up-Conversion Fluorescence: Noncoherent Excitation by Sunlight," *Physical Review Letters* (Oct. 6, 2006), PRL 97:143903-1 ~ 143903-3.
Baluschev, S. et al., "A general approach for non-coherently excited annihilation up-conversion: transforming the solar-spectrum," *New Journal of Physics* (2008), 10:013007-1 ~ 013007-12.
Carmichael, Arian J. et al., "Polarity study of some 1-alkyl-3-methylimidazolium ambient-temperature ionic liquids with the solvatochromic dye, Nile Red," *J. Phys. Org. Chem.* (2000), 13:591-595.
Kawai, Akio et al., "Electron spin dynamics of triplet and doublet molecules in room temperature ionic liquids studied by a time-resolved EPR method," *Molecular Physics* (May 20-Jun. 10, 2006), vol. 104, Nos. 10-11, 1573-1579.
Miteva, Tzenka et al., "Annihilation assisted upconversion: all-organic, flexible and transparent multicolour display," *New Journal of Physics* (2008), 103002-1 ~ 103002-10.

(Continued)

*Primary Examiner* — Ling Choi
*Assistant Examiner* — Jessica E Whiteley
(74) *Attorney, Agent, or Firm* — Kilpatrick Townsend & Stockton LLP

(57) ABSTRACT

To provide a light conversion element which has solved the problems of the reduced intensity of upconverted light, etc., due to the flammability, volatility or high viscosity of a medium used in the conventional photon upconversion elements.
A light conversion element is provided which has solved the above problems by using a visually homogeneous and transparent light conversion element, wherein organic photosensitizing molecules and organic light-emitting molecules, which are a combination that exhibits a triplet-triplet annihilation process, are dissolved and/or dispersed in an ionic liquid.

17 Claims, 20 Drawing Sheets

(56) References Cited

OTHER PUBLICATIONS

Monguzzi, Angelo et al., "Multicomponent Polymeric Film for Red to Green Low Power Sensitized Up-Conversion," *J. Phys. Chem. A* (2009), 113:1171-1174.

Plechkova, Natalia V. et al., "Applications of ionic liquids in the chemical industry," *Chem. Soc. Rev.* (2008), 37:123-150.

Shiflett, Mark B. et al., "Liquid-Liquid Equilibria in Binary Mixtures Containing Substituted Benzenes with Ionic Liquid 1-Ethyl-3-methylimidazolium Bis(trifluoromethylsulfonyl)imide," *J. Chem. Eng. Data* (2010), 55:346-353.

Singh-Rachford, Tanya N. et al., Boron Dipyrromethene Chromophores: Next Generation Triplet Acceptors/Annihilators for Low Power Upconversion Schemes, *J. Am. Chem. Soc.* (2008), 130:16164-16165.

Singh-Rachford, Tanya N. et al., "Influence of Temperature on Low-Power Upconversion in Rubbery Polymer Blends," *J. Am. Chem. Soc.* (2009), 131(33): 12007-12014.

Singh-Rachford, Tanya N. et al., Triplet Sensitized Red-to-Blue Photon Upconversion, *J. Phys. Chem. Lett.* (2010) 1:195-200.

Yakutkin, Vladimir et al., "Towards the IR Limit of the Triplet-Triplet Annihilation-Supported Up-Conversion: Tetraanthraporphyrin," *Chem. Eur. J.* (2008), 14:9846-9850.

\* cited by examiner

Fig. 1

| PROPERTY | ORGANIC SOLVENTS | IONIC LIQUIDS |
|---|---|---|
| NUMBER OF SOLVENTS | >1,000 | >1,000,000 |
| APPLICABILITY | SINGLE FUNCTION | MULTIFUNCTION |
| CATALYTIC ABILITY | RARE | COMMON AND TUNEABLE |
| CHIRALITY | RARE | COMMON AND TUNEABLE |
| VAPOR PRESSURE | OBEYS THE CLAUSIUS-CLAPEYRON EQUATION | NEGLIGIBLE VAPOR PRESSURE UNDER NORMAL CONDITIONS |
| FLAMMABILITY | USUALLY FLAMMABLE | USUALLY NONFLAMMABLE |
| SOLVATION | WEAKLY SOLVATING | STRONGLY SOLVATING |
| POLARITY | CONVENTIONAL POLARITY CONCEPTS APPLY | POLARITY CONCEPT QUESTIONABLE |
| TUNEABILITY | LIMITED RANGE OF SOLVENTS AVAILABLE | VIRTUALLY UNLIMITED RANGE MEANS "DESIGNER SOLVENTS" |
| COST | NORMALLY CHEAP | TYPICALLY BETWEEN 2 AND 100 TIMES THE COST OF ORGANIC SOLVENTS |
| RECYCLABILITY | GREEN IMPERATIVE | ECONOMIC IMPERATIVE |
| VISCOSITY/cP | 0.2–100 | 22–40,000 |
| DENSITY/g cm$^{-3}$ | 0.6–1.7 | 0.8–3.3 |
| REFRACTIVE INDEX | 1.3–1.6 | 1.5–2.2 |

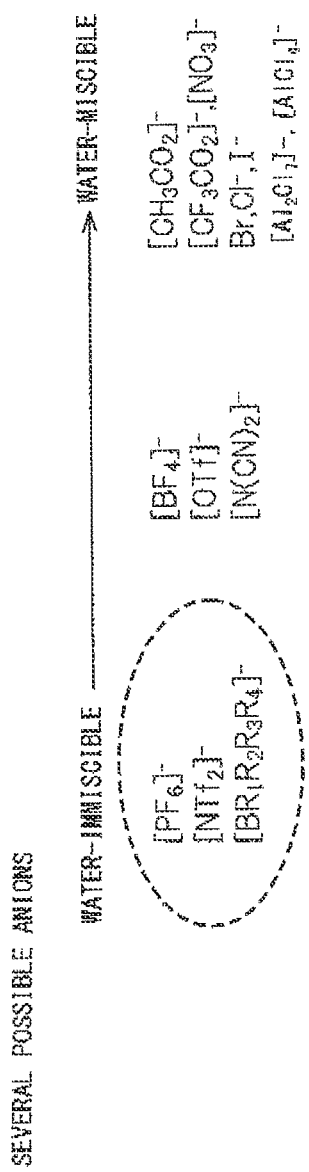

LIGHT CONVERSION ELEMENT CONTAINING IONIC LIQUID, A PROCESS FOR MAKING SAME, AND AN APPARATUS COMPRISING THE LIGHT CONVERSION ELEMENT

TECHNICAL FIELD

The present invention relates to a light conversion element containing an ionic liquid, a method for making the element, and an apparatus comprising the light conversion element.

BACKGROUND ART

Amid a strong need for alternative energy such as a clean energy in efforts to prevent global warming, the development of technology for converting sunlight: into a secondary energy (electric power, hydrogen, etc.) in an efficient manner is urgently needed. Expectations are rising for systems such as photovoltaics and hydrogen generating photocatalysts, etc., having high light-conversion efficiency. In the solar cells or the hydrogen generating photocatalysts etc., only the wavelength regions shorter than a specific threshold wavelength that is inherent to the system have been used among the broad wavelength range of sunlight. Thus, as one of the technologies for effectively utilizing the broad wavelength range of the sunlight, photon upconversion (in which light of a long wavelength is absorbed and then light of a shorter wavelength is emitted, thereby changing the wavelength of the light.) is being investigated.

Research on photon upconversion using multiphoton absorption of rare-earth elements as a means for photon upconversion has a history of 50 years or more. However, multiphoton absorption of rare-earth elements generally requires a very high incident light intensity, which has made this method difficult to be applied to weak light such as sunlight as a target for conversion.

In recent years, organic molecules capable of conducting photon upconversion by light absorption and emission were disclosed.

Patent document 1 describes a composition for upconverting a photon energy, the composition comprising a first component that absorbs energy at a first wavelength region by serving as a photoreceptor of at least phthalocyanine, metal porphyrin, metal phthalocyanine etc., and a second component that emits energy at a second wavelength region by serving as a light emitter of polyfluorene, oligofluorene, copolymer thereof, poly-paraphenylene, etc.

Non-patent document 1 describes photon upconverters that use a triplet-triplet annihilation process (hereinafter referred to as "TTA process") between organic molecules, which up-converted relatively weak light whose intensity is close to sunlight in toluene solvent.

As a medium for organic molecules in a photon upconverter, there is a precedent example that used a high molecular weight organic polymer.

Patent document 2 describes the use of a system for photon upconversion comprising at least one polymer and at least one sensitizer containing at least one heavy atom, wherein the triplet energy level of the sensitizer is higher than the triplet energy level of the polymer.

Non-patent document 2 describes a photon upconverter wherein cellulose acetate polymer (molecular weight about 100,000) was used as a dispersion medium for organic molecules. However, the Non-patent document 2 discloses no quantitative data on the upconversion quantum yield of the photon conversion element.

Non-patent document 3 describes a photon upconverter which uses, as a medium, rubbery polymer that has a glass transition temperature (Tg) of 236K (−37° C.) and which is soft at room temperature. The Non-patent document 3 describes that, because the photon upconversion based on the TTA process requires exchange of energies between organic molecules carrying a triplet excitation energy through their diffusive motions and resultant intermolecular collisions within the medium, the intensity of the upconversion light emission increases in a relatively high temperature range (>300K) in which the polymer has sufficient fluidity, but in the lower temperature range (≤300K) in which the fluidity of the medium is low, the intensity of the upconversion light emission becomes very weak. However, the Non-patent document 3 discloses no quantitative data on the upconversion quantum yield of the photon upconverter.

Non-patent document 4 describes photon upconverters that uses styrene oligomer (a mixture of styrene trimers and tetramers) as a medium for organic photosensitizing molecules and organic light-emitting molecules. The Non-patent document 4 describes that, when a sample was scanned at about 10 kHz with a laser having an output of about 14 $W/cm^2$ as an excitation light, the upconversion quantum yield of as high as 3.2% was obtained. While the Non-patent document 4 uses its unique index called "the mean excitation intensity" in order to represent a light excitation intensity and describes that the index was about 5 $mW/cm^2$, it does not clearly specify the definition of this unique index.

Non-patent document 5 describes that metal porphyrins and metal phthalocyanines are usable as organic photosensitizing molecules, and molecules such as 9,10-bis(phenylethynyl)anthracene, perylene, rubrene etc., are usable as light-emitting molecules, for photon upconversion that uses the TTA process.

Non-patent document 6 describes a general review on ionic liquids, stating that the nature of an ionic liquid is, as shown in FIG. 1 cited from the Non-patent document 6, usually nonflammable, has negligible vapor pressure under normal conditions, and it is questionable whether the concept of polarity and non-polarity may directly apply to the ionic liquid or not, and the like.

Non-patent document 7 describes, based on experimental results, the miscible proportions of a non-water miscible ionic liquid (1-ethyl-3-methylimidazolium bis(trifluoromethylsulfonyl)imide) with several general organic solvents. The Non-patent document 7 describes that the proportion (miscible proportion) at which an organic solvent can mix homogeneously with an ionic liquid without layer separation depends on either or both of the polarity (dipole moment: D) and size of an organic solvent molecule, and that the higher the polarity of the organic solvent molecule becomes, the possible mixing ratio of the organic solvent in the non-water miscible ionic liquid increases.

Non-patent document 8 describes that experiments of measuring the polarity of various ionic liquids that have 1-alkyl-3-methylimidazolium as a cation had been carried out, and that, based on the result of the experiments, these ionic liquids have polarities comparable to those of short chain alcohols.

Non-patent document 9 describes that upon trying to determine the properties of porphyrins, which are polycyclic aromatic π electron-conjugated molecules, in an ionic liquid, the obtained signal was very weak because the molecules hardly dissolved in the ionic liquid. Regarding this fact, the authors of this article stated "The polarity of room-temperature ionic liquids are similar to acetonitrile and alcohols such as methanol and 2-propanol according to the previous studies, and we assume that typical aromatic compounds are not soluble in room-temperature ionic liquids."

CITATION LIST

Patent Documents

Patent document 1: Japanese Patent No. 4518313
Patent document 2: Published Japanese Translation of PCT International Publication for Patent Application (Kohyo) No. 2008-506798

Non-Patent Documents

Non-patent document 1: S. Baluschev et al., Physical Review Letters, vol. 97, pp. 143903-1 to 143903-4, 2006
Non-patent document 2: A. Monguzzi et al., Journal of Physical Chemistry A, vol. 113, pp. 1171-1174, 2009
Non-patent document 3: Tanya N. Singh-Rachford at al., Journal of the American Chemical Society, vol. 131, pp. 120007-12014, 2009
Non-patent document 4: T. Miteva at al., New Journal of Physics, vol. 10, pp. 103002-1 to 103002-10, 2008
Non-patent document 5: S. Baluschev et al., New journal of Physics, vol. 10, pp. 013007-1 to 013007-12, 2008
Non-patent document 6: N. V. Plechkova and K. R. Seddon, Chemical Society Reviews, vol. 37, pp. 123-150, 2008
Non-patent document 7: M. B. Shiflett and A. M. S, Niehaus, Journal of Chemical and Engineering Data, vol. 55, pp. 346-353, 2010
Non-patent document 8: A. J. Carmichael and K. R. Seddon, Journal of Physical Organic Chemistry, vol. 13, pp. 591-595, 2000
Non-patent document 9: A. Kawai et al., Molecular Physics, vol. 104, pp. 1573-1579, 2006
Non-patent document 10: V. Yakutkin et al., Chemistry—A European Journal, vol. 14, pp. 9846-9850, 2008
Non-patent document 11: T. N. Singh-Rachford et al., Journal of the American Chemical Society, vol. 130, pp. 16164-16165, 2008
Non-patent document 12: T. N. Singh-Rachford and F. N. Castellano, Journal of Physical Chemistry Letters, vol. 1, pp. 195-200, 2010

SUMMARY OF INVENTION

Problems to be Solved by the Invention

In a photon upconverter that uses the TTA process, in principle, since it was necessary for organic molecules to engage in their diffusive motions and intermolecular collisions in order to exchange their energies with each other in a media, and therefore, volatile organic solvents such as toluene and benzene, etc., were conventionally used, as described above. However, since the volatile organic solvents have a safety issue of being flammable and are highly volatile, there were problems that containers having a high sealability are required in order to avoid adverse effects on the environment and changes with time of light conversion elements, and that resin materials that are soluble in solvents or that are swelled by the penetration of solvent molecules could not be used for the containers for light conversion elements.

Furthermore, even if styrene trimer that is an oligomer was used as a medium for organic solvents, the problems of flammability (The Manufacturing Safety Data Sheet (MSDS) of Siyaku.com by Wako Pure Chemical Industries describes on the storing method "Stored sealed in a refrigerator (−20° C.)), volatility (about 425 Pa at 2200: B. J. Meister et al., Industrial and Engineering Chemistry Research, vol. 28, pp. 1659-1664, 1989) and insufficient fluidity as a medium due to high viscosity at room temperature, etc., could not be solved.

As described above, when polymer compounds such as cellulose acetate and flexible rubber, etc., are used as the medium, in addition to the flammability, being solid and/or poor fluidity at room temperature (300 K) or temperature lower than that caused a problem that intensities of upconverted light had been remarkably reduced, and thus upconversion had not been accomplished to the extent that upconversion quantum yield could be investigated.

As described above, photon upconverters that uses the TTA process of organic molecules can also be applied to light as weak as sunlight, and thus are promising as a method for carrying out highly efficient photon upconversion. However, because of the problems of the flammability and volatility of the conventionally used medium, or the reduced upconversion light intensities due to the high viscosity of the medium, etc., there existed a problem that need to be solved before they are put into practical use.

On the other hand, ionic liquids, which are generally in liquid-state at room temperature, have extremely low vapor pressures and high thermal stabilities, which conventional solvents do not have. However, without wishing to be bound by any theories, it is known from past experimental studies, as described in, for example, in the Non-patent documents 8 and 9, that ionic liquids are a polar solvent that has a polarity comparable to that of methanol or acetonitrile. Ionic liquids having polarity, can also be intuitively understood from that they are composed of "ions". On the other hand, π electron-conjugated molecules, in particular polycyclic aromatic π electron-conjugated molecules (as used in the above Non-patent documents 1 to 5), are generally used as organic molecules that are used in photon upconversion based on the TTA process. These molecules are generally non-polar (or weakly polar), and based on the idea of the conventional solvation chemistry, these organic molecules will be dissolved little in ionic liquids that are polar media, and even if they were dissolved by any methods, it is expected that these organic molecules cannot stably exist in ionic liquids (i.e., the precipitation or aggregation is expected to occur sooner or later). In fact, these polycyclic aromatic π electron-conjugated molecules are generally not dissolved in methanol, which coincides well with the aforementioned expectation based on the solvation chemistry.

Non-patent document 11 describes that, although an attempt was made to measure the properties of polycyclic aromatic π electron-conjugated molecules (tetraphenylporphyrin) in an ionic liquid, the obtained signal was weak, since the solubility of the molecules in the ionic liquid was remarkably low. On this point, the authors of the Non-patent document 11 stated "we assume that typical aromatic compounds are not soluble in room-temperature ionic liquids."

Thus, the prediction based on the solvation chemistry and the past experimental facts indicated in the Non-patent document 11 that organic molecules, in particular, polycyclic aromatic it electron-conjugated molecules which are used in photon upconverters that use the TTA process, are hardly dissolvable in ionic liquids, have given a negative outlook for the use of ionic liquids as a medium for this application. In other words, the reason why the use of ionic liquids as the medium for photon upconverters that use the TTA process had not been investigated nor reported previously was due to such a negative expectation and outlook, which appeared to be almost obvious when based on the conventional knowledge and experiences.

Means to Solve the Problems

One embodiment of the present invention is a visually homogeneous and transparent light conversion element, wherein organic photosensitizing molecules and organic light-emitting molecules, which are a combination that exhibits the TTA process, are dissolved and/or dispersed in an ionic liquid.

Another embodiment of the present invention is a method for producing a visually homogeneous and transparent light conversion element, the method comprising the steps of: a) forming an organic solution or organic solutions in which organic photosensitizing molecules and organic light-emitting molecules, which are a combination that exhibits the TTA process, are dissolved in a volatile organic solvent or volatile organic solvents, b) mixing an ionic liquid with the organic solution(s) by stirring to form a visually homogeneous and transparent solution and/or dispersion, and c) removing the volatile organic solvent (s) under reduced pressure from this solution and/or dispersion to a trace amount or less.

Effects of the Invention

According to a light conversion element of an embodiment of the present invention, there is provided a light conversion element utilizing the TTA process, in which the element is not only free of toxicity and adverse effects on the environment resulting from the volatility of the medium due to its extremely low vapor pressure, but also the liquid thereof has an adequate fluidity while retaining safety such as non-flammability, etc., and furthermore in which resin materials can be used for the container thereof.

BRIEF DESCRIPTION OF DRAWINGS

FIG. 1 illustrates a list in which the properties of ionic liquids, described in the Non-patent document 6 were compared with those of conventional organic solvents (Table 4 in the Non-patent document 6).

FIG. 2 illustrates how the water miscibility and non-water miscibility of ionic liquids change depending on the type of anions contained in the ionic liquid for several representative anions described in the Non-patent document 6 (FIG. 9 in the Non-patent document 6).

MODE FOR CARRYING OUT THE INVENTION

Figure 3:
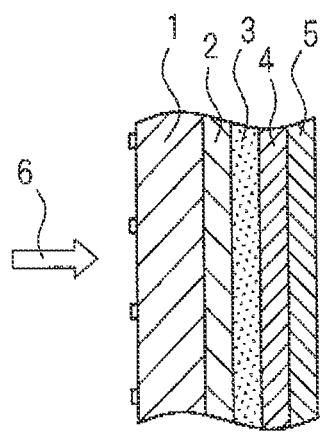
FIG. 3 illustrates a cross-sectional schematic view of an example in which a light conversion element according to an embodiment of the present invention was used in a solar cell.

The present invention will now be explained in further detail for the purpose of illustrating representative examples of the present invention. It should be noted, however, that the present invention is not limited to these embodiments in any way.

As described above, in a light conversion element based on the TTA process, a medium is required to allow for the diffusional motions of organic molecules inside thereof. The present inventors have conducted intensive and extensive investigations with the idea of fabricating a light conversion element using an ionic liquid that generally has the properties of extremely low vapor pressures, relatively high fluidity, and flame retardancy, etc., instead of media such as conventionally used organic solvents such as toluene and benzene, etc., rubbery polymers which are flammable, poorly fluid and very highly viscous, and oligomers which have flammability and practically not low vapor pressures, etc., and have found that the above problems can be solved according to the following embodiments, and therefore have reached the present invention.

One embodiment of the present invention is a visually homogeneous and transparent light conversion element, wherein organic photosensitizing molecules and organic light-emitting molecules, which are a combination that exhibits the TTA process, are dissolved and/or dispersed in an ionic liquid.

As used herein,

The term "ionic liquid" refers to a room-temperature molten salt that is comprised of cations and anions and that is liquid at 25° C.

The term "visually homogeneous and transparent" denotes that, in the case of an ionic liquid and a solution having organic photosensitizing molecules and organic light-emitting molecules dissolved in a volatile organic solvent, the volatile organic solution of the organic photosensitizing molecules and the organic light emitting molecules, relative to the ionic liquid exhibits no layer separation into two or more layers visually, and to the visually confirmable degree, they are homogeneous and transparent without any turbidity or cloudiness; and in the case of an ionic liquid and organic photosensitizing molecules and organic light-emitting molecules, the solution and/or dispersion of the organic photosensitizing molecules and the organic light emitting molecules in the ionic liquid has no solids, and is homogeneous and transparent without any turbidity or cloudiness, to the visually confirmable degree.

Ionic liquids are known to generally have extremely low vapor pressure and flame retardancy. It is known that there are at least 1,000,000 or more types of ionic liquids, due to the combination of a cation and an anion (The Non-patent document 6). Their melting temperatures are often near the room temperature as they are referred to as "room-temperature molten salts". In the TTA process according to an embodiment of the present invention, an ionic liquid as a medium should be one that allows for diffusional motion of organic molecules within thereof, and thus in this embodiment, an ionic liquid that is liquid at room temperature is used.

With regard to the vapor pressure, since ionic liquids generally have extremely low vapor pressures, they can be used in the embodiments of the present invention. For example, it is described that the vapor pressure of 1-ethyl-3-methylimidazolium bis(trifluoromethylsulfonyl)imide according to an embodiment of the present invention is $1\times10^{-9}$ Pa at room temperature (25° C.) and $1.8\times10^{-6}$ Pa at 80° C., and that the vapor pressure of 1-butyl-3-methylimidazolium bis(rifluoromethi-ylsulfonyl)imide according to an embodiment of the present invention is $8\times10^{-9}$ Pa at room temperature (25° C.) and $1.4\times10^{-6}$ Pa at 8000 (D. H. Zaitsau et al., Journal of Physical Chemistry A, vol. 110, pp. 7303-7306), and they have low vapor pressures.

According to the Japanese Industrial Standard (JIS), $1\times10^{-5}$ Pa or lower is ultrahigh vacuum, and thus the vapor pressures of all of these ionic liquids lie in the ultrahigh vacuum range.

In recent years, ionic liquids are called "room-temperature molten salts", and some type of ionic liquids may have a high viscosity. However, the ionic liquids according to an embodiment of the present invention have low viscosities at working temperatures including the room temperature, as described below. For example, according to an embodiment of the present invention, at 300K, 11-propyl-2,3-dimethylimidazolium bis(trifluoromethylsulfonyl)imide (which is also called 1,2-dimethyl-3-propylimidazolium bis(trifluoromethylsulfonyl)) has a low viscosity of 0.082 Pa·S (S. I. Fletcher et al., Journal of Chemical and Engineering Data, vol. 55, pp. 778-782, 2010).

To present further examples, it is described that the viscosity of 1-ethyl-3-methylimidazolium bis(trifluoromethylsulfonyl)imide according to an embodiment of the present invention at 303.48K and the viscosity of 1-butyl-3-methylimidazolium bis(trifluoromethylsulfonyl)imide at 302.93K are respectively 0.029 Pa·s and 0.041 Pa·s (J. Jacquemic et al., Green Chemistry, vol. 8, pp. 172-180, 2006).

With regard to thermal stability, it is described that the onset temperatures of thermal decomposition ($T_{onset}$) of 1-ethyl-3-methylimidazolium bis(trifluoromethylsulfonyl)imide and 1-propyl-2,3-dimethylimidazolium his (trifluoromethylsulfonyl) according to an embodiment of the present invention measured by thermogravimetric analysis (TGA) are respectively 453° C. and 462° C. (H. L. Ngo et al., Thermochimica Acta, vol. 97, pp. 357-358, 2000).

Further, also at the result of TGA measurements, in which the starting temperature of thermal decomposition ($T_{start}$) was defined as the temperature at which the thermal decomposition starts to occur even in a very small amount, it is described that the thermal decomposition initiation temperature ($T_{start}$) of 1-propyl-2,3-dimethylimidazolium his (trifluoromethylsulfonyl) according to an embodiment of the present invention is 385° C., and the thermal decomposition initiation temperature (T$_{start}$) of 1-butyl-3-methyl imidazolium bis(trifluoromethylsulfonyl)imide according to an embodiment of the present invention is 330° C. (C. P. Fredlake et al., Journal of Chemical and Engineering Data, vol. 49, pp. 954-964, 2004).

In any case, such thermal stabilities are so high as to be inconceivable for conventional organic solvents, and also in this regard, an advantage of using ionic liquids according to the present invention as the medium has been found.

As described above, according to an embodiment of the present invention, a light conversion element not only having a very low vapor pressure and no toxicity and no adverse effects on the environment due to the volatility of a medium at room temperature, but also having a sufficient fluidity while retaining the safety such as non-flammability, etc., is provided.

Without wishing to be bound by any theory, while ionic liquids have the aforementioned properties such as low volatility and flame retardancy, etc., ionic liquids generally have polarity comparable to the polarity of short-chain alcohols or acetonitrile. Thus, based on the common technical knowledge of solvation chemistry, polycyclic aromatic a electron-conjugated molecules that are non-polar (or weakly polar) molecules are expected to be hardly soluble in ionic liquids that are polar medium. Even if they could be dissolved somehow, it is expected that such molecules cannot remain stably present in an ionic liquid (i.e., the precipitation or aggregation is expected to occur sooner or later). This matter has already been described experimentally in the Non-patent document 11, and, also in the specification of the present application, this matter has been reconfirmed in Comparative Examples 1-3 as described below. On the other hand, in general, as described in FIG. 1, it was also pointed out that whether the conventional idea of polarity-nonpolarity is directly applicable to ionic liquids is questionable.

Focusing on the above peculiarity of ionic liquids as the possibility of breakthrough, the present inventors have conducted investigations and, surprisingly, have found that a light conversion element according to the present invention can be accomplished by the following embodiment.

Another embodiment of the present invention is a visually homogeneous and transparent light conversion element in which organic photosensitizing molecules and organic light-emitting molecules, which are a combination that exhibits the TTA process, are dissolved and/or dispersed in an ionic liquid, wherein the ionic liquid has "cation-π interaction" with the organic photosensitizing molecules and the organic light-emitting molecules and is water-immiscible.

As used herein, the term "cation-π interaction" refers to an energy-stabilizing interaction between a cation in an ionic liquid and π electrons in an organic photosensitizing molecule and an organic light-emitting molecule, and the term "water-immiscible" means that while 10% by weight or less of water may be visually homogeneously and transparently mixed with an ionic liquid, but over 10% by weight of water does not visually homogeneously and transparently mix with an ionic liquid.

According to the present embodiment, by using a cation which has "cation-π interaction" between itself and organic photosensitizing molecules and organic light-emitting molecules as a cation in an ionic liquid, the stability of dissolution/dispersion of the organic photosensitizing molecule and the organic light-emitting molecule in the ionic liquid can be enhanced.

Without wishing to be bound by any theories, the reason why organic photosensitizing molecules and organic light-emitting molecules are stably dissolved and/or dispersed in an ionic liquid may be conceived as follows. To begin with, as shown in Comparative Examples 1-3 below, the organic photosensitizing molecules and the organic light-emitting molecules according to the present invention are hardly dissolved/dispersed directly into an ionic liquid. This can be believed because the organic photosensitizing molecules as well as the organic light-emitting molecules are aggregated as solid due to the π-π stacking, i.e., overlapping of a electron clouds between the molecules, and thus these molecular solids do not dissolve/disperse into an ionic liquid. However, once the solid aggregates have been dissolved/dispersed, it is believed that, as a cation of the ionic liquid, by using one which has "cation-π interaction" with the organic photosensitizing molecule and the organic light-emitting molecule, for example, the re-aggregation due to the π-π stacking among the organic photosensitizing molecules and the organic light-emitting molecules is prevented, and rather, the stability of the dissolution and/or dispersion in the ionic liquid is enhanced through the organic photosensitizing molecules and the organic light-emitting molecules being more stably interacting with the ionic liquid.

Furthermore, it has been found that the presence of such a stabilizing mechanism of the organic photosensitizing molecules and the organic light-emitting molecules in an ionic liquid due to the "cation-interaction" is strongly suggested by the results of comparative experiments (Comparative Examples 14-21).

As cations in ionic liquids according to an embodiment of the present invention, cations of a wide range of ionic liquids can be used without limitation, as long as they exhibit "cation-π interaction."

As cations exhibiting such "cation-π interaction" of ionic liquids, for example, 1-alkyl-3-methylimidazoliums such as 1-ethyl-3-methylimidazolium, 1-butyl-3-methylimidazolium, 1-hexyl-3-methylimidazolium, and 1-octyl-3-methylimidazolium, etc.; 1-alkyl-2,3-dimethylimidazoliums such as 1-ethyl-2,3-dimethylimidazolium, 1-propyl-2,3-dimethylimidazolium, 1-butyl-2,3-dimethylimidazolium, 1-pentyl-2,3-dimethylimidazolium 1,1-hexyl-2,3-dimethylimidazolium, 1-heptyl-2,3-dimethylimidazolium, and 1-octyl-2,3-dimethylimidazolium, etc.; nitrogen-containing compound cations including aromatic amines, aliphatic amines, and alicyclic amines, etc., such as imidazolium cations, pyridinium cations, piperidinium cations, pyrrolidinium cations, pyrazolium cations, thiazolium cations, quaternary ammonium cations and morpholinium cations including 1-cyanomethyl-3-methylimidazolium, 1-(2-hydroxyethyl)-3-methylimidazolium, L-butylpyridinium, 1-hexylpyridinium, N-(3-hydroxypropyl)pyridinium, N-hexyl-4-dimethylaminopyridinium, N,N-diethyl-N-methyl-N-(2-methoxyethyl) ammonium, N-ethyl-N,N-dimethyl-2-methoxyethylammonium, N-(methoxyethyl)-N-methylmorpholium, 1-(2-methoxyethyl)-1-methylpyrrolidinium, 1-(methoxyethyl)-methylpiperidinium, and N-(methoxyethyl)-1-methylpyrrolidinium, etc.; quaternary phosphonium cations such as tetraalkyl phosphonium and tetraphenyl phosphonium, etc.; and sulfonium cations such as trialkyl sulfonium and triphenyl sulfonium, etc., can be mentioned but they are not limited thereto.

These cations may be one or a mixture of two or more cations.

It is described that, depending on the type of anion in an ionic liquid, the ionic liquid can mix with water infinitely, but depending on the type of anion in the ionic liquid, the ionic liquid does not mix with water more than a certain proportion or only a trace amount thereof mixes (Non-patent document 6).

After extensive research on ionic liquids, the present inventors have found that, when an ionic liquid containing an anion that imparts water-immiscibility to the ionic liquid is used, among the anion groups shown in FIG. 2 as an anion of thereof, a visually homogeneous and transparent light conversion element can be obtained by dissolving and/or dispersing organic photosensitizing molecules and organic light-emitting molecules in the ionic liquid.

To begin with, the organic photosensitizing molecules and the organic light-emitting molecules according to the present invention hardly directly dissolve/disperse into an ionic liquid, as shown in Comparative Examples 1-3 below. Without wishing to be bound by any theories, it is expected, based on the idea of conventional polarity-nonpolarity about solvents, that non-polar (or weakly polar) aromatic π electron-conjugated molecules (in particular, polycyclic aromatic π electron-conjugated molecules) are hardly soluble in ionic liquids that have polarities comparable to that of short-chain alcohols or acetonitrile. Despite these negative predictions, it was found out that, by using the method according to an embodiment of the present invention, keeping these organic molecules stably dissolved or dispersed in ionic liquids for a long time was possible.

As for the mechanism, the "cation-π interaction" has been strongly suggested as the rational mechanism by the results of Comparative Examples 14-21 described below, but it is not conclusive. Without wishing to be bound by any theories, according to an embodiment of the present invention, by using, as an ionic liquid, an ionic liquid that can mix with water up to a certain proportion but do not mix beyond that proportion or an ionic liquid that is hardly mix with water (water-immiscible), organic photosensitizing molecules and an organic light-emitting molecules can be visually homogeneously dissolved and/or dispersed in the ionic liquid (for example, FIG. 4), and thus the light conversion element of the present invention can be provided. On the other hand, it was found as shown in Comparative Examples 4-7 described below that, when water-miscible ionic liquids are used, an ionic liquid and an organic solvent in which organic photosensitizing molecules and organic light-emitting molecules have been dissolved do not mix in a visually homogeneous manner, resulting in a bilayer separation between the ionic liquid and the organic solvent, thereby failing to provide a homogeneous light conversion element.

Anions of ionic liquids can be used without limitation as long as they impart water-immiscibility to the ionic liquids, and may comprise, but not limited to, fluorine-containing compound-based anions such as bis(trifluoromethylsulfonyl)imide ($[N(SO_2CF_3)_2]^-$), tris(trifluoromethylsulfonyl)methide $[C(SO_2CF_3)_3]^-$), hexafluorophosphate ($[PF_6]^-$), and tris(pentafluoroethyl)trifluorophosphate ($[(C_2F_5)_3PF_3]^-$), etc., and $[BR_1R_2R_3R_4]^-$ ($R_1$, $R_2$, $R_3$, and $R_4$ are independently $CH_3(CH_2)_n$ (wherein n=1, 2, 3, 4, 5, 6, 7, 8, or 9) or aryl).

These anions may be one or a mixture of two or more anions.

From the foregoing, as ionic liquids according to an embodiment of the present invention, among the combinations of anions and cations of the above-mentioned ionic liquids, ionic liquids comprising, but not limited to, 1-ethyl-3-methylimidazolium bis(trifluoromethylsulfonyl)imide, 1-butyl-3-methylimidazolium bis(trifluoromethylsulfonyl)imide, 1-hexyl-3-methylimidazolium bis(trifluoromethylsulfonyl)imide, 1-octyl-3-methylimidazolium bis(trifluoromethylsulfonyl)imide, 1-propyl-2,3-dimethylimidazolium bis(trifluoromethylsulfonyl)imide, 1-butyl-2,3-dimethylimidazolium his (trifluoromethylsulfonyl)imide, N,N-diethyl-N-methyl-N-(2-methoxyethyl)ammonium bis(trifluoromethylsulfonyl)imide, 1-ethyl-3-methylimidazolium tris (trifluoromethylsulfonyl)methide, 1-butyl-3-methylimidazolium tris(trifluoromethylsulfonyl)methide, 1-hexyl-3-methylimidazolium tris(trifluoromethylsulfonyl)methide, 1-octyl-3-methylimidazolium tris(trifluoromethylsulfonyl)methide, 1-propyl-2,3-dimethylimidazolium tris (trifluoromethylsulfonyl)methide, 1-butyl-2,3-dimethylimidazolium tris(trifluoromethylsulfonyl)methide, N,N-diethyl-N-methyl-N-(2-methoxyethyl)ammonium tris (trifluoromethylsulfonyl)methide, 1-ethyl-3-methylimidazolium tris(pentafluoroethyl)trifluorophosphate, 1-butyl-3-methylimidazolium tris(pentafluoroethyl) trifluorophosphate, 1-hexyl-3-methylimidazolium tris (pentafluoroethyl)trifluorophosphate, 1-octyl-3-methylimidazolium tris(pentafluoroethyl) trifluorophosphate, 1-propyl-2,3-dimethylimidazolium tris (pentafluoroethyl)trifluorophosphate, 1-butyl-2,3-dimethyl imidazolium tris(pentafluoroethyl)trifluorophosphate, N,N-diethyl-N-methyl-N-(2-methoxyethyl)ammonium tris(pentafluoroethyl)trifluorophosphate, 1-ethyl-3-methylimidazolium hexafluorophosphate, 1-butyl-3-methylimidazolium hexafluorophosphate, 1-hexyl-3-methylimidazolium hexafluorophosphate, 1-octyl-3-methylimidazolium hexafluorophosphate, 1-propyl-2,3-dimethylimidazolium hexafluorophosphate, 1-butyl-2, 3-dimethylimidazolium hexafluorophosphate, N,N-diethyl-N-methyl-N-(2-methoxyethyl)ammonium hexafluorophosphate, 1-ethyl-3-methylimidazolium $[BR_1R_2R_3R_4]^-$, 3-butyl-3-methylimidazolium $[BR_1R_2R_3R_4]^-$, 1-hexyl-3-methylimidazolium $[BR_1R_2R_3R_4]^-$, 1-octyl-3-methylimidazolium $[BR_1R_2R_3R_4]^-$, 1-propyl-2,3-dimethylimidazolium $[BR_1R_2R_3R_4]^-$, 1-butyl-2,3-dimethylimidazolium. $[BR_1R_2R_3R_4]^-$, N,N-diethyl-N-methyl-N-(2-methoxyethyl) ammonium $[BR_1R_2R_3R_4]^-$ ($R_1$, $R_2$, $R_3$, and $R_4$ are independently $CH_3(CH_2)N$ (wherein n=1, 2, 3, 4, 5, 6, 7, 8, or 9), or aryl), 1-butylpyridinium hexafluorophosphate, 1-hexylpyridinium hexafluorophosphate, 1-ethyl-3-methylimidazolium tris(pentafluoroethyl)trifluorophosphate, 1-cyanomethyl-3-methylimidazolium bis(trifluoromethylsulfonyl)imide, N-hexyl-4-dimethylaminopyridinium bis(trifluoromethylsulfonyl)imide, 1-(2-hydroxyethyl)-3-methylimidazolium bis(trifluoromethylsulfonyl)imide, N-(3-hydroxypropyl) pyridinium bis(trifluoromethylsulfonyl)imide, N-ethyl-N,N-dimethyl-2-methoxyethylammonium tris(pentafluoroethyl) trifluorophosphate, 1-(2-hydroxyethyl)-3-methylimidazolium tris(pentafluoroethyl) trifluorophosphate, N-(3-hydroxypropyl)pyridinium tris (pentafluoroethyl)trifluorophosphate, N-(methoxyethyl)-N-methylmorpholium tris(pentafluoroethyl)trifluorophosphate, 1-(2-methoxyethyl)-1-methyl-pyrrolidinium tris(pentafluoroethyl)trifluorophosphate, 1-(methoxyethyl)-1-methylpiperidinium tris(pentafluoroethyl)trifluorophosphate, 1-(methoxyethyl)-1-methylpiperidinium bis(trifluoromethylsulfonyl)imide, N-(methoxyethyl)-1-methylpyroridinium bis(trifluoromethylsulfonyl)imide, and N-(methoxyethyl)-N-methylmorpholium bis(trifluoromethylsulfonyl)imide can be mentioned but they are not limited thereto.

According to an embodiment of the present invention, a light conversion element utilizing the TTA process is provided, the element being stable for a long time without exhibiting re-aggregation or precipitation of organic photosensitizing molecules and organic light-emitting molecules in an ionic liquid.

As used herein, "stable for a long time" means that when retained at 80° C. for 100 hours in an inert gas atmosphere, the peak positions and the spectral intensities of the optical absorption spectrum originating from organic photosensitizing molecules and organic light-emitting molecules do not vary by greater than the measurement error before and after the retention.

As has been described above, for example, when a cation in an ionic liquid has the "cation-π interaction" toward the organic photosensitizing molecule and the organic light-emitting molecule, and/or the ionic liquid has water-immiscibility because of the type of the anion, then it is believed to enhance the solubility and/or dispersibility of the organic photosensitizing molecules and the organic light-emitting molecules in the ionic liquid, and/or the stability thereof in the ionic liquid, which is advantageous in terms of long-term stability.

The viscosity of the light conversion element according to an embodiment of the present invention may not be specifically limited, but since upconversion light emission originates from the TTA process, it may suitably be liquid in a temperature range such as −100° C. to 200° C., −50° C. to 100° C., and −30° C. to 80° C., etc., in which the light conversion element is used. The viscosity of the light conversion element according to an embodiment of the present invention can be, at 300K, 0.000001 Pa·s or more, 0.00001 Pa·s or more, 0.0001 Pa·s or more, and 0.001 Pa·s or more, and can be 1 Pa·s or less, 10 Pa·s or less, 100 Pa·s or less, and 1000 Pa·s or less.

The melting point (T) and the solidification temperature ($T_f$) of the light conversion element according to an embodiment of the present invention may not be specifically limited, but since light emission originates from the TTA process, it may suitably be liquid in a temperature range in which the light conversion element is used. The melting point can be −200° C. or more, 10° C. or less, 0° C. or less, −10° C. or less, −30° C. or less, and −50° C. or less. The solidification temperature can be −200° C. or more, 0° C. or less, −10° C. or less, −30° C. or less, and −50° C. or less. For use in a normal room environment, both the melting point and the solidification temperature may preferably be 0° C. or less.

When the light conversion element according to an embodiment of the present invention is used in an apparatus, the moisture content may be adjusted to be 1% by weight or less, 0.1% by weight or less, 0.01% by weight or less, and 0.001% by weight or less.

When oxygen is present, it can quench an excited state of molecules during the TTA process which gives rise to the lowering of the conversion efficiency, and thus in the light conversion element according to an embodiment of the present invention, the oxygen concentration may be adjusted to be 100 ppm or less, 10 ppm or less, 1 ppm or less, and 0.1 ppm or less.

For these purposes, an oxygen getter and/or a water-absorbing material can coexist in an apparatus that has the light conversion element according to an embodiment of the present invention.

As organic photosensitizing molecules and organic light-emitting molecules that can be used in the present invention, any molecules of which combination emits light based on the TTA process can be widely used without limitation. Further, the absorption wavelength and emission wavelength can be selected, without limitation, from the range of sunlight spectrum. By way of example, in the embodiment of photon upconversion in the visible-to-near-infrared range, π electron-conjugated molecules that have a light-absorption band and/or light-emission band in the visible-to-near-infrared range can be used.

As the organic photosensitizing molecule according to an embodiment of the present invention, metal porphyrins such as meso-tetraphenyl-tetrabenzoporphyrin metal complexes and octaethylporphyrin metal complexes, etc., and metal phthalocyanines can be mentioned but they are not limited thereto. As a metal in the complex, there can be used Pt, Pd, Ru, Rh, Ir, Zn or Cu, etc. As an organic light-emitting molecule, there can be used, but not limited to, 9,10-diphenylanthracene, 9,10-bis(phenylethynyl) anthracene, perylene, rubrene, etc. As an organic photosensitizing molecule and an organic light-emitting molecule that emit light based on the TTA process, aromatic π electron-conjugated compounds, in particular polycyclic aromatic π electron-conjugated compounds, etc., including those described in the Non-patent document 5 can be widely used.

The content of the organic photosensitizing molecule and the organic light-emitting molecule in the light conversion element may not be specifically limited, unless it causes reduction in the TTA process and/or the light conversion efficiency. The light conversion element according to an embodiment of the present invention can contain each of the organic photosensitizing molecule and the organic light-emitting molecule at 0.00001% by weight or more, 0.00001% by weight or more, 0.0001% by weight or more, and 1% by weight or less, 5% by weight or less, and 10% by weight or less.

Another embodiment of the present invention is a method for producing a visually homogeneous and transparent light conversion element, the method comprising the steps of: a) forming an organic solution or organic solutions in which organic photosensitizing molecules and organic light-emitting molecules, which are a combination that exhibits the TTA process, are dissolved in a volatile organic solvent or volatile organic solvents, b) mixing an ionic liquid with the organic solution(s) by stirring to form a visually homogeneous and transparent solution and/or dispersion, and c) removing the volatile organic solvent (s) under reduced pressure from this solution and/or dispersion to a trace amount or less.

According to this embodiment, by adding a solution or solutions, in which organic photosensitizing molecules and organic light-emitting molecules have been dissolved in a volatile organic solvent or volatile organic solvents, to an ionic liquid and by stirring, they can be mixed in the ionic liquid in a visually homogeneous and transparent manner.

As used herein, "stirring" is referred to as moving a liquid-containing container itself, moving an object or objects in the liquid, oscillating an object or objects in the liquid, flowing the liquid itself, oscillating the liquid itself, ejecting a gas into the liquid, or to perform two or more of these procedures sequentially or simultaneously, and to cause these procedures to occur indirectly. The liquid can contain a solid or solids. Furthermore, "stirring" can include one that utilizes an ultrasound, or the utilization or the combined utilization of an energy or energies which molecules vibrate or absorb such as a microwave, etc.

As used herein, "a trace amount" for a volatile organic solvent refers to an amount at which the volatile organic solvent can be detected at a level equal to or lower than the noise level relative to the ionic liquid, based on the measurement of the absorption spectrum.

Without wishing to be bound by any theories, while it is believed that the concept of solubility based on the conventional polarity-nonpolarity applies to the dissolution of organic photosensitizing molecules and organic light-emitting molecules in a volatile organic solvent, the concept of solubility based on the conventional polarity-nonpolarity does not apply to the dispersion/dissolution of a volatile organic solution/volatile organic solutions containing organic photosensitizing molecules and organic light-emitting molecules in an ionic liquid. Thus, based on the idea similar to that explained in the above relating to the anions of ionic liquids, it can be believed that, by using an ionic liquid that may be miscible with water up to a certain proportion but not miscible with water beyond that proportion (water-immiscible), a volatile organic solvent/volatile organic solvents containing the organic photosensitizing molecules and organic light-emitting molecules can be mixed visually homogeneously and transparently with an ionic liquid.

Furthermore, according to this embodiment, after a volatile organic solution/volatile organic solutions was/were mixed into an ionic liquid visually homogeneously and transparently, it was found that, even if the volatile organic solvent/volatile organic solvents was/were removed from the mixture to a trace amount or less, the organic photosensitizing molecules and the organic light-emitting molecules can be kept dissolved and/or dispersed visually homogeneously and transparently in the ionic liquid.

Without wishing to be bound by any theories, it is believed that, after the removal of the volatile organic solvent(s), the visually homogeneous and transparent dissolution and/or dispersion of the organic photosensitizing molecules and organic light-emitting molecules in an ionic liquid is stably maintained due to the energy-stabilizing interaction that is considered to be the "cation-π interaction" described in the above section relating to the cations of ionic liquids.

As the volatile organic solvent according to an embodiment of the present invention, any solvent can be used widely without limitation, as long as it can dissolve organic photosensitizing molecules and organic light-emitting molecules relating to an embodiment of the present invention, can mix with water-immiscible ionic liquids homogeneously and transparently, and can be removed to the extent of a trace amount under a reduced pressure, and aromatic solvents such as toluene, benzene and xylene, etc., can be appropriately selected depending on the solubility of the organic photosensitizing molecules and the organic light-emitting molecules.

The stirring according to an embodiment of the present invention is not specifically limited, as long as a solution of organic photosensitizing molecules and organic light-emitting molecules dissolved in a volatile organic solvent can be mixed with an ionic liquid, and a technology or apparatus such as ultrasound, bubbling, a stirrer, a liquid delivery pump, a mill, a bead mill, a homogenizer, a wet jet mill, and a microwave, etc., can be used, alone or in combination.

As has been explained in the section of the light conversion element according to the present invention, if an ionic liquid used for the production of this light conversion element has the cation-π interaction with the organic photosensitizing molecules and the organic light-emitting molecules and is water-immiscible, the ionic liquid can dissolve and/or disperse the organic photosensitizing molecules and the organic light-emitting molecules visually homogeneously and transparently in the ionic liquid and can stabilize the dissolution and/or dispersion of the organic photosensitizing molecules and the organic light-emitting molecules in the ionic liquid.

In the method for producing this light conversion element, a cation or an anion in the ionic liquid is not specifically limited, and a cation or an anion described relating to the above light conversion element can be used. Such a cation or an anion may be one or a combination of two or more.

With regard to the intended use, the light conversion element according to an embodiment of the present invention can be used in solar cells, photocatalysts, photocatalytic hydrogen/oxygen generating devices and the like.

For example, FIG. 3 is a cross sectional schematic diagram of an apparatus, wherein, in a solar cell having a photovoltaic layer 1, a transparent backside electrode 2, a transparent insulating film 3, and a light-reflecting film 5, an upconversion film layer 4 using the light conversion element relating to an embodiment of the present invention has been disposed, by way of example, in between the transparent insulating film and the light-reflecting film. According to the constitution of FIG. 3, for example, by upconverting an incident light 6 from sunlight, the intensity of light in the wavelength range that can be used for power generation by the photovoltaic layer can be enhanced, which leads to further enhancement of the power generation efficiency.

By disposing, for example, a photocatalyst layer instead of the photovoltaic layer 1 in FIG. 3, a photocatalyst and a photocatalytic hydrogen/oxygen generating apparatus having a high catalytic efficiency can be realized.

The light conversion element according to an embodiment of the present invention may not be specifically limited to the above construction, and may be disposed, for example, in between the transparent back side electrode and the transparent insulating film as required.

EXAMPLES

The present invention will now be explained more specifically with reference to Examples, but it should be noted that the present invention is not limited to them in any way.

Hereinbelow, ionic liquids, organic light-emitting molecules, organic photosensitizing molecules, organic volatile solvents and apparatuses used in Working Examples and Comparative Examples according to an embodiment of the present invention are shown in detail.

Ionic Liquids

Ionic liquids that have been found to be capable of producing a stable and satisfactory photon upconverter according to an embodiment of the present invention:

Ionic liquid #1: 1-ethyl-3-methylimidazolium bis(trifluoromethylsulfonyl)imide (manufacturer: Covalent Associates Inc., CAS No. 174899-82-2)

Ionic liquid #2: 1-propyl-2,3-dimethylimidazolium bis(trifluoromethylsulfonyl)imide (manufacturer: Covalent Associates Inc., CAS No. 169051-76-7)

Ionic liquid #3: 1-butyl-3-methylimidazolium his (trifluoromethylsulfonyl)imide (manufacturer: Covalent Associates Inc., CAS No. 174899-83-3)

Ionic liquid #4: 1-propyl-2,3-dimethylimidazolium bis(trifluoromethylsulfonyl)imide (manufacturer: Covalent Associates Inc., CAS No. 169051-77-8)

Ionic liquid #5: N,N-diethyl-N-methyl-N-(2-methoxyethyl)ammonium bis(trifluoromethyl sulfonyl)imide (manufacturer: Nisshinbo, supplier: Kanto Kagaku, product No. 11468-55, CAS No. 464927-84-2)

Ionic liquid #6: 1-hexyl-3-methylimidazolium bis(trifluoromethylsulfonyl)imide (manufacturer: Kanto Kagaku, CAS No. 382150-50-7)

Ionic liquid #7: 1-octyl-3-methylimidazolium bis(trifluoromethylsulfonyl)imide (supplier: Kanto Kagaku, product No. 49514-85, CAS No. 178631-04-4)

Ionic liquid #8: 1-ethyl-2,3-dimethylimidazolium bis(trifluoromethylsulfonyl)imide (supplier: Kanto Kagaku, product No. 49515-52, CAS No. 174899-90-2)

Ionic liquid #9: 1-butyl-2,3-dimethylimidazolium bis(trifluoromethylsulfonyl)imide (supplier: Kanto Kagaku, product No. 49515-66, CAS No. 350493-08-2)

All of #1 to 49 are water-immiscible ionic liquids.

Ionic liquids that caused visually recognizable layer separation with an organic solvent in which organic photosensitizing molecules and organic light-emitting molecules were dissolved, and thus were not suitable for producing a light conversion element, even though the method according to the present invention was applied:

Ionic liquid #10: N,N-diethyl-N-methyl-N-(2-methoxyethyl) ammonium tetrafluoroborate (manufacturer: Nisshinbo, supplier: Kanto Kagaku, product No, 11469-45, CAS No. 464927-72-8)

Ionic liquid #11: 1-methyl-3-propylimidazolium iodide (supplier: Tokyo Kasei, product No. M1440, CAS No. 119171-18-5)

Ionic liquid #12: 1-ethyl-3-methylimidazolium trifluoroacetate (supplier: Merck, product No. 490147, CAS No. 174899-65-1)

Ionic liquid #13: 1-ethyl-3-methylimidazolium acetate (supplier: Kanto Kagaku, product No. 49514-02, CAS No. 143314-17-4)

All of #10 to #13 are water miscible ionic liquids.

Organic Photosensitizing Molecules

Organic photosensitizing molecule #1: Meso-tetraphenyl-tetrabenzoporphyrin palladium (CAS No. 119654-64-7)

Organic photosensitizing molecule #2: Octaethylporphyrin palladium (CAS No. 24804-00-0)

Organic Light-Emitting Molecules

Organic light-emitting molecule #1: Perylene (CAS No. 198-55-0)

Organic light-emitting molecule #2: 9,10-bis(phenylethynyl)anthracene (CAS No. 10075-85-1)

Organic light-emitting molecule #3: 9,10-diphenylanthracene (CAS No. 1499-10-1)

Volatile Organic Solvents

Toluene (manufacturer: Wako Pure Chemical, product No. 209-13445)

Benzene (manufacturer: Wako Pure Chemical, product No. 021-12301)

Normal hexane (manufacturer: Wako Pure Chemical, product No. 082-06901)

Cyclohexane (manufacturer: Aldrich, product No. 227048)

Apparatuses

Bath sonicator (manufacturer: Branson, model No. Model 3510)

Glass Pasteur pipet (manufacturer: Fisher Scientific, product No. 5-5351-01)

Vacuum chamber (made of aluminum, inner diameter 10 cm×height 6 cm, cylindrical, custom-made)

Rotary pump (manufacturer: ULVAC, product No. GLD-051, the designed attainable pressure is 1 Pa or less)

Scroll pump (manufacturer: Edwards, product No. XDS35i, the designed attainable pressure is 1 Pa or less)

Turbo molecular pump (manufacturer: Pfeiffer Vacuum, product No. HiCube80, the practically attainable vacuum is about $10^{-4}$ to $10^{-5}$ Pa)

Continuous-wave laser emitting device #1 (wavelength: 632.8 nm, manufacturer: CV1 Melles Griot, product No. 05LHP991)

Continuous-wave laser emitting device #2 (wavelength: 532.0 nm, manufacturer: AOTK, product No. Action532S)

Continuous-wave laser emitting device #3 (He—N laser, wavelength: 632.8 nm, manufacturer: CV1 Melles Griot, product No. 25 LHP 928-249), output: about 30 mW, laser spot diameter=about 1 mm. Immediately before a measurement sample, an iris was set, and the laser spot diameter was made to be 0.8 mm at the sample position (excitation intensity=about 6 W/cm$^2$).

Continuous-wave laser emitting device #4 (diode laser, wavelength: 407 nm, manufacturer: World Star Tech, product No. TECBL-30GC-405)

Continuous-wave laser emission #1: In the above Continuous-wave laser emitting device #1, excitation light: 632.8 nm, spot diameter: about 1 mm, output: about 11 mW.

Continuous-wave laser emission #2: In the above Continuous-wave laser emitting device #2, excitation light: 532.0 nm, output: about 10 mW.

Monochromator (manufacturer: Roper Scientific, product No. SP-2300i)

Thermoelectrically cooled silicon CCD detector (manufacturer: Roper Scientific, product No. Pixis100BR, 1340 pixels in the horizontal direction)

CCD laser beam profiler (manufacturer: Ophir, product No. SP620)

Diffraction grating monochromator (manufacturer: PI Acton, product No. SP2300)

UV-VIS near-infrared spectrophotometer (manufacturer: Shimadzu, product No. UV-3600)

Reduced-pressure treatment #1: At room temperature, using the rotary pump, pressure was reduced for about 5 hours to about 12 hours (Working Examples 1-34 and 46-56)

Reduced-pressure treatment #2: At room temperature, using the turbo molecular pump, pressure was reduced for 10 hours or more (Working Examples 35-45 and 57-64)

There were no meaningful differences observed between the results obtained by the reduced-pressure treatments #1 and #2.

Working Example 1

Figure 4:
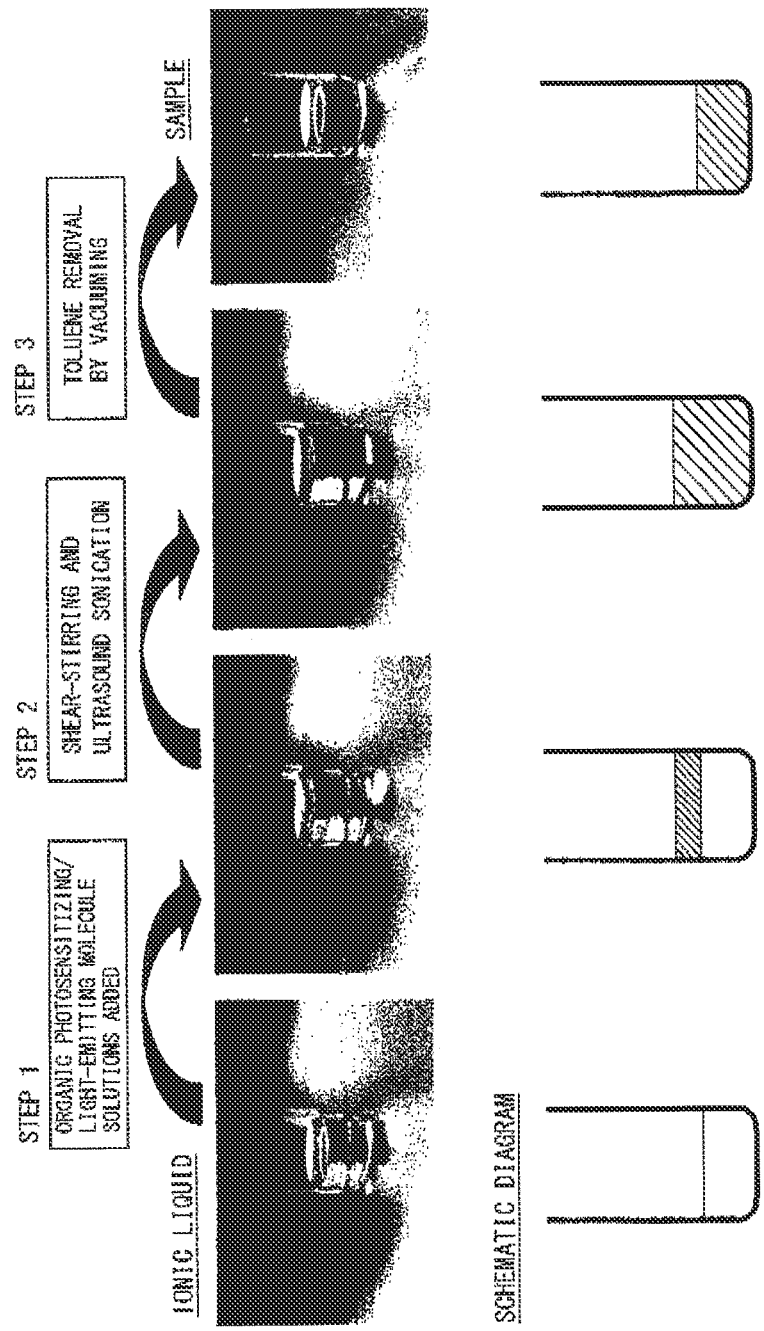
FIG. 4 illustrates, in a stepwise manner, the procedure of dissolving and/or dispersing organic photosensitizing molecules and organic light-emitting molecules according to an embodiment of the present invention in an ionic liquid.

Dissolution/Dispersion of Organic Photosensitizing Molecules and Organic Light-Emitting Molecules in an Ionic Liquid By means of the following three steps, organic photosensitizing molecules and organic light-emitting molecules were dissolved and/or dispersed in an ionic liquid (the photographs and schematic diagram of these steps are shown in FIG. 4).

Step 1

At room temperature, 400 µl of the ionic liquid #1 (colorless and transparent) was put into a glass vial of 5-10 ml capacity. Next, after additions of 501 of 4×10$^{-4}$ M toluene solution of the organic photosensitizing molecule #1 and 100 µl of 4×10$^{-3}$ M toluene solution of the light-emitting molecule #1 to this ionic liquid, the layers remained separated where the bottom layer was the colorless-and-transparent ionic liquid #1 and the top layer was the toluene solution containing the green organic photosensitizing molecule #1 and the organic light-emitting molecule #1.

Step 2

By repeating "suction-and-ejection" of the liquid in the above step 1 using a glass Pasteur pipet, the mixture was confirmed to become visually homogeneous and transparent. After that, the glass vial was capped, and then underwent ultrasonic dispersion in a bath sonicator for about 30 minutes, to further enhance the homogeneity of the mixture liquid.

Step 3

After removing the cap from the glass vial that contains the mixture solution of the ionic liquid and organic solvent obtained in the step 2, the vial was placed in a vacuum chamber and subjected to the reduced-pressure treatment described above. As a result, a visually homogeneous-and-transparent single-layered ionic liquid solution and/or dispersion of the organic photosensitizing molecules and the organic light-emitting molecules were obtained. When it was taken out from the vacuum chamber and remaining toluene in the sample was quantified using a spectrophotometer, the results for both the reduced-pressure treatment #1 and the reduced-pressure treatment #2 were below 1.0% by weight, confirming that toluene in the ionic liquid solution and/or dispersion was removed to a level of the trace amount.

The dissolution and/or dispersion of the organic photosensitizing molecule #1 and the organic light-emitting molecule #1 in the ionic liquid #1 is graphically shown in FIG. 4. (Only in the Working Example 1 as an exception, the remaining toluene in the sample was evaluated with the spectrophotometer for both the reduced-pressure treatments #1 and #2).

Working Examples 2 to 17

Except that the ionic liquids, the organic photosensitizing molecules, and the organic light-emitting molecules shown in Table 1 were employed, the same procedure as that in Working Example 1 was followed, and visually homogeneous-and-transparent single-layered solutions and/or dispersions were obtained. Working Example 1 is also shown in the Table 1 below.

TABLE 1

| Working Example | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| Ionic liquid | #1 | #1 | #1 | #1 | #2 | #2 | #2 | #2 | #3 | #3 | #3 | #3 | #4 | #5 | #5 | #6 | #6 |
| Organic photosensitizing molecule | #1 | #1 | #2 | #2 | #1 | #1 | #2 | #2 | #1 | #1 | #2 | #2 | #1 | #1 | #1 | #1 | #1 |
| Organic light-emitting molecule | #1 | #2 | #1 | #3 | #1 | #2 | #1 | #3 | #1 | #2 | #1 | #3 | #1 | #1 | #2 | #1 | #2 |

Working Example 18

Experiment to Confirm Light Conversion of a Light Conversion Element

Figure 5:
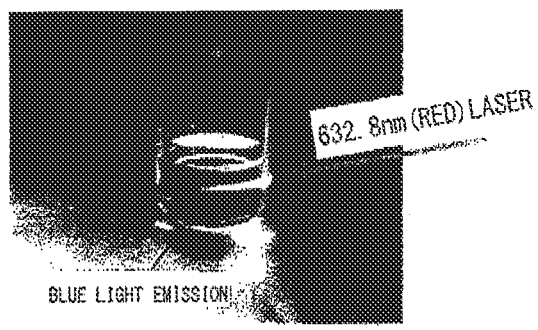
FIG. 5 illustrates how organic photosensitizing molecules and organic light-emitting molecules according to an embodiment of the present invention dissolved and/or dispersed in an ionic liquid upconvert an incident light.

At room temperature, the sample prepared in the Working Example 1 was placed in a glove box under a nitrogen atmosphere. After placing a sealing cap onto the glass vial, the vial was taken out from the glovebox. When a continuous-wave laser emission #1 was irradiated, under the indoor condition with the indoor illumination on, a bright blue upconverted light emission was sufficiently visually confirmed. The excitation power density was calculated to be about 2 W/cm based on the spot diameter of the laser beam. The state in which the upconversion is taking place is shown in FIG. 5.

Working Examples 19 to 34

Except that the samples and continuous-wave laser emission shown in the following Table 2 were used, a continuous-wave laser was irradiated to each sample under the same condition as the Working Example 18. Under the indoor condition with the indoor illumination on, a bright blue-to-"blue-green" upconverted light emission was sufficiently visually confirmed. Working Example 18 is also shown in the Table 2 below.

Figure 6:
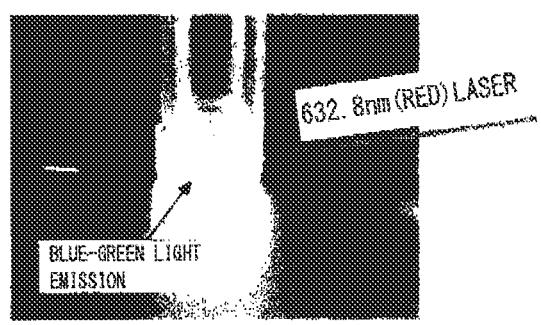
FIG. 6 illustrates how organic photosensitizing molecules and organic light-emitting molecules according to an embodiment of the present invention dissolved and/or dispersed in an ionic liquid upconvert an incident light.

The state in which the upconversion is taking place in the sample of Working Example 2 is shown in FIG. 6.

TABLE 2

| Working Example | 18 | 19 | 20 | 21 | 22 | 23 | 24 | 25 | 26 | 27 | 28 | 29 | 30 | 31 | 32 | 33 | 34 |
|---|---|---|---|---|---|---|---|---|---|---|---|---|---|---|---|---|---|
| Working Example No. of the sample used | 1 | 2 | 3 | 4 | 5 | 6 | 7 | 8 | 9 | 10 | 11 | 12 | 13 | 14 | 15 | 16 | 17 |
| Continuous-wave laser emission | #1 | #1 | #2 | #2 | #1 | #1 | #2 | #2 | #1 | #1 | #2 | #2 | #1 | #1 | #1 | #1 | #1 |

For the above samples, the upconverted light emitted from the sample was collimated with a lens, then focused onto the entrance slit: (the slit width: 150 μm) of a monochromator with another lens, and subsequently diffracted by the diffraction grating inside of the monochromator. Then, the spectrum of the upconversion light was measured and recorded with a thermoelectrically cooled CCD detector.

The spectra of Working Examples 18, 22 and 30 (Working Examples 1, 5 and 13) were measured under the same measurement condition and the same laser alignment condition, and thus the relative intensities of the ordinate can be compared. From every sample, spectrum of the upconverted light emission was measured. From the quantitative comparison among the spectra, the trend of the upconversion intensity decreasing from the ionic liquids #1 of the lowest viscosity to #2, and to #4 of the highest viscosity was observed.

Figure 8:
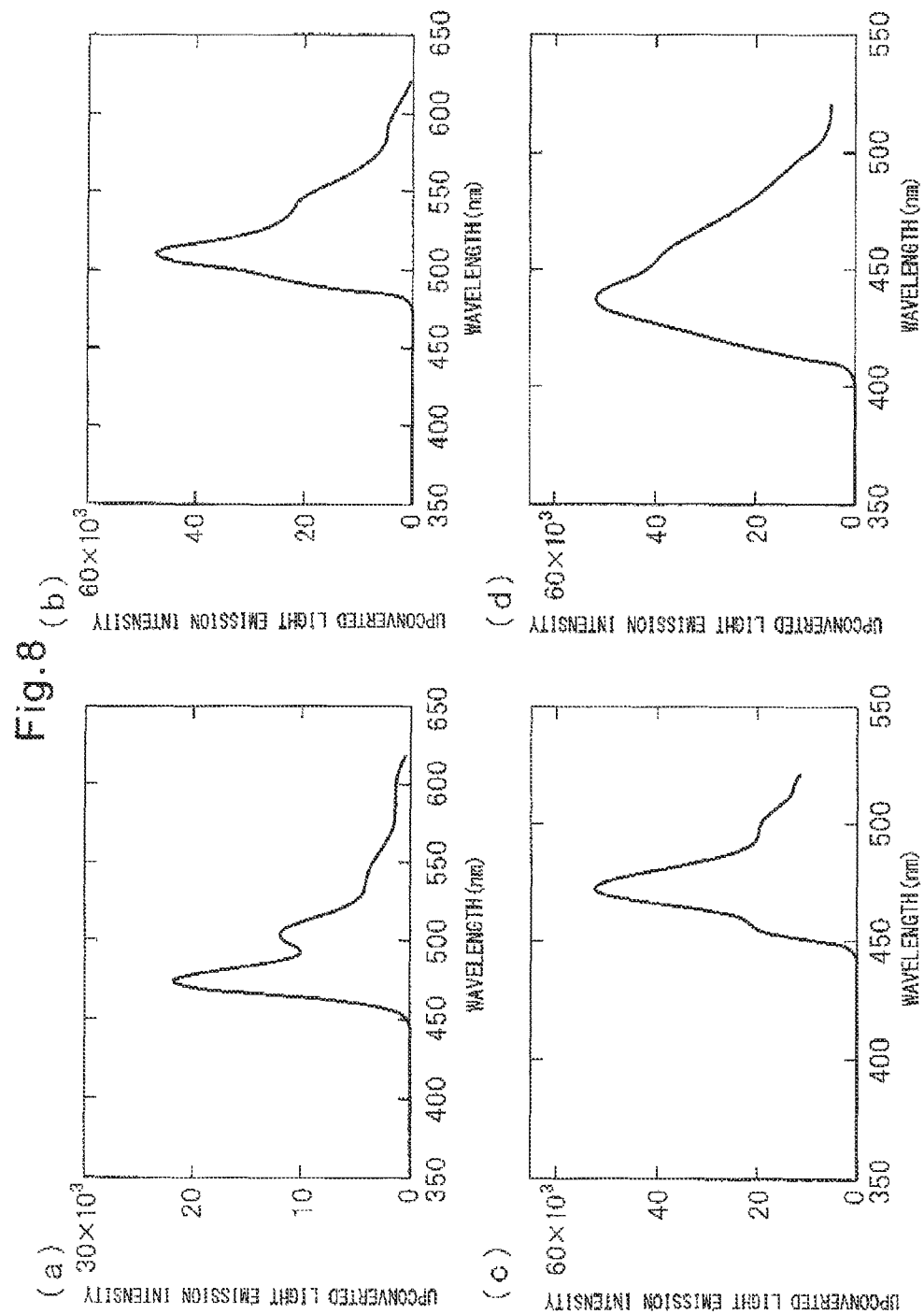
FIG. 8($a$) to ($d$) illustrate the spectra of upconverted light emitted from samples in which organic photosensitizing molecules and organic light-emitting molecules according to an embodiment of the present invention were dissolved and/or dispersed in each ionic liquid.
Figure 9:
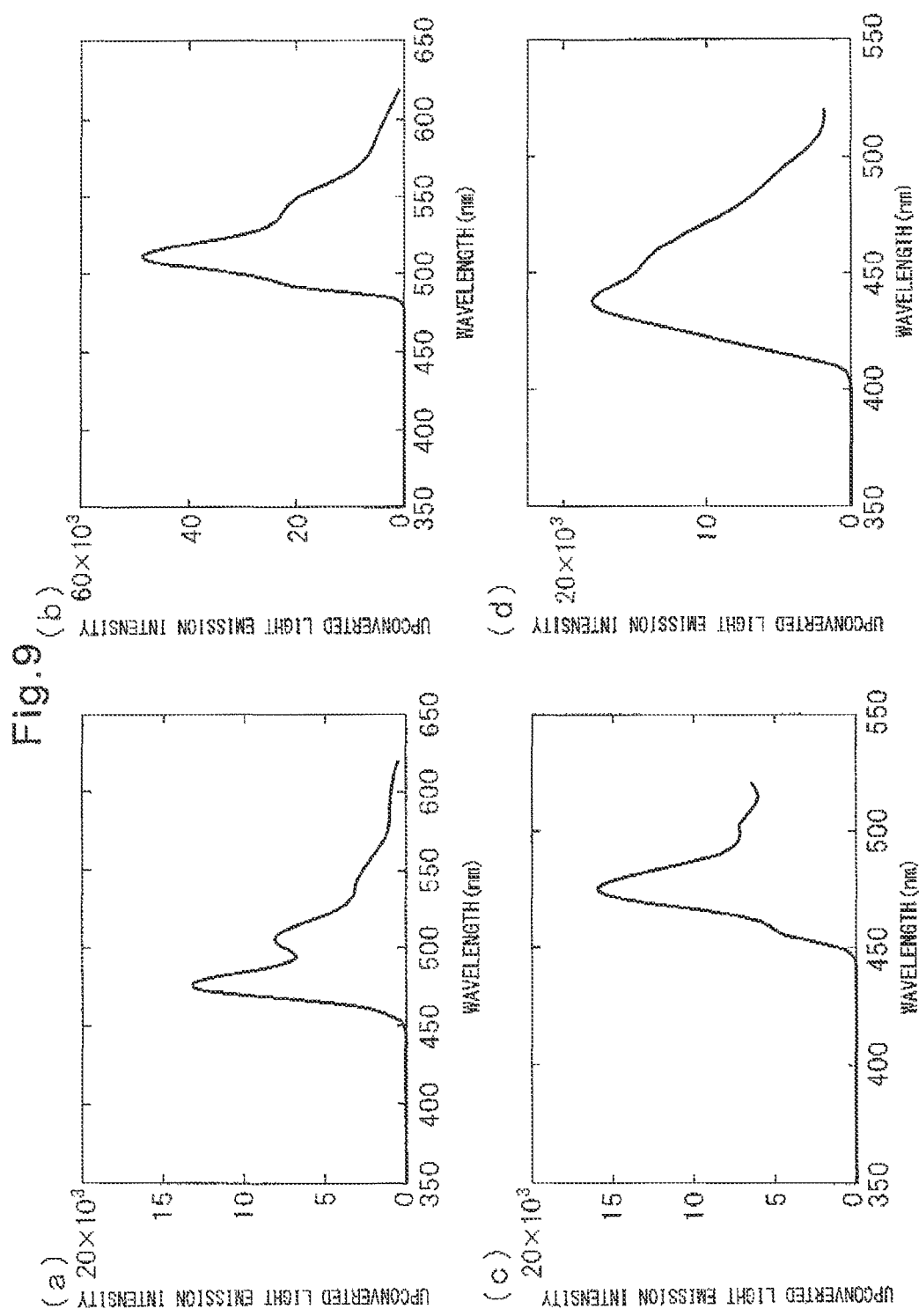
FIG. 9($a$) to ($d$) illustrate the spectra of upconverted light emitted from samples in which organic photosensitizing molecules and organic light-emitting molecules according to an embodiment of the present invention were dissolved and/or dispersed in each ionic liquid.
Figure 10:
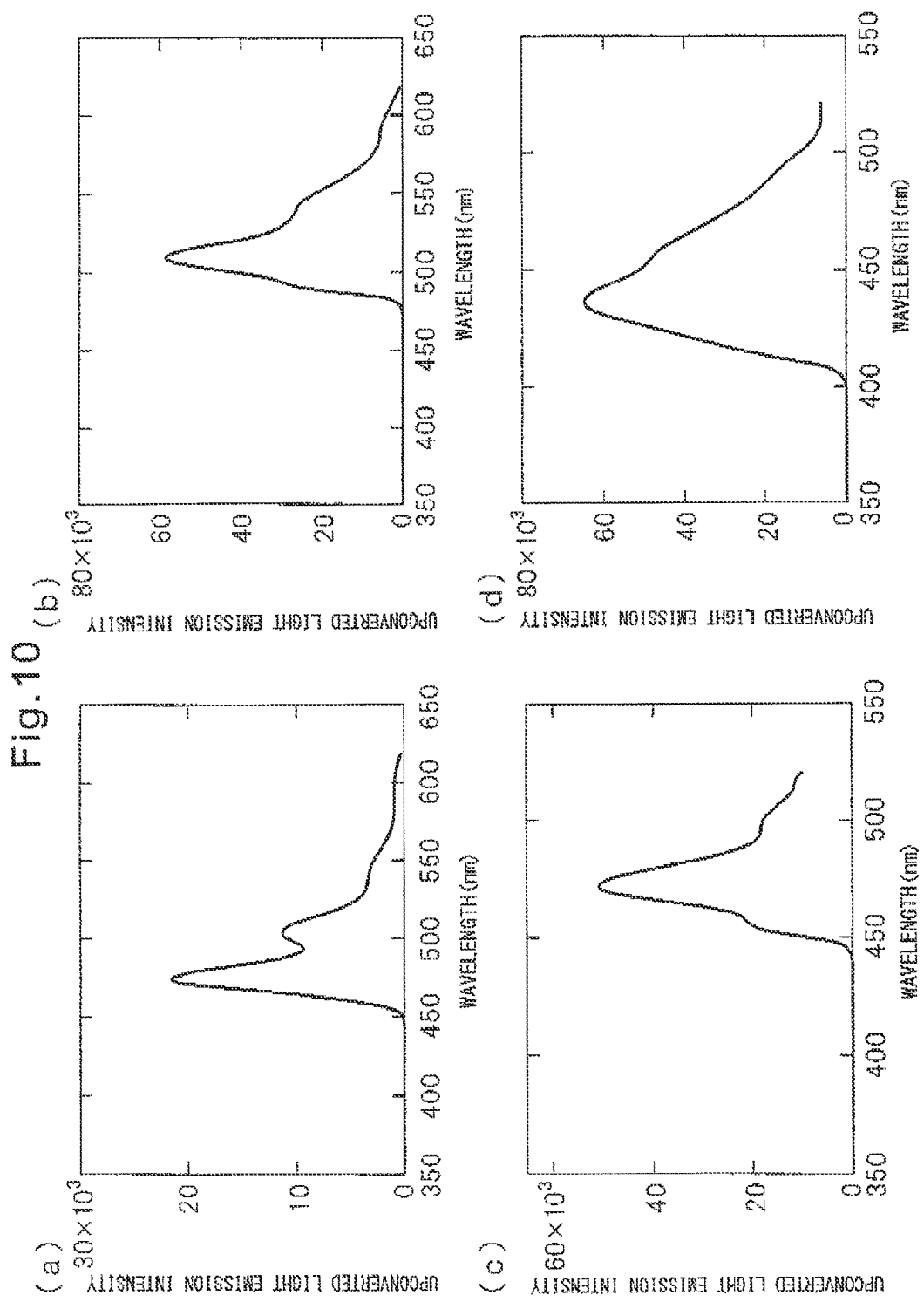
FIG. 10($a$) to ($d$) illustrate the spectra of upconverted light emitted from samples in which organic photosensitizing molecules and organic light-emitting molecules according to an embodiment of the present invention were dissolved and/or dispersed in each ionic liquid.
Figure 11:
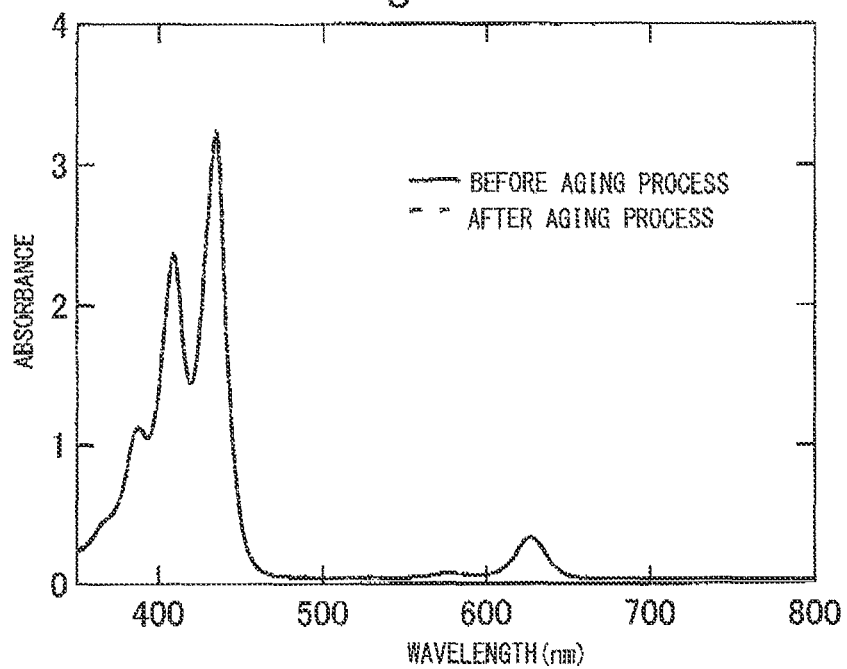
FIG. 11 illustrates the comparison of optical absorption spectra before and after the aging test of a light conversion element according to an embodiment of the present invention.
Figure 12:
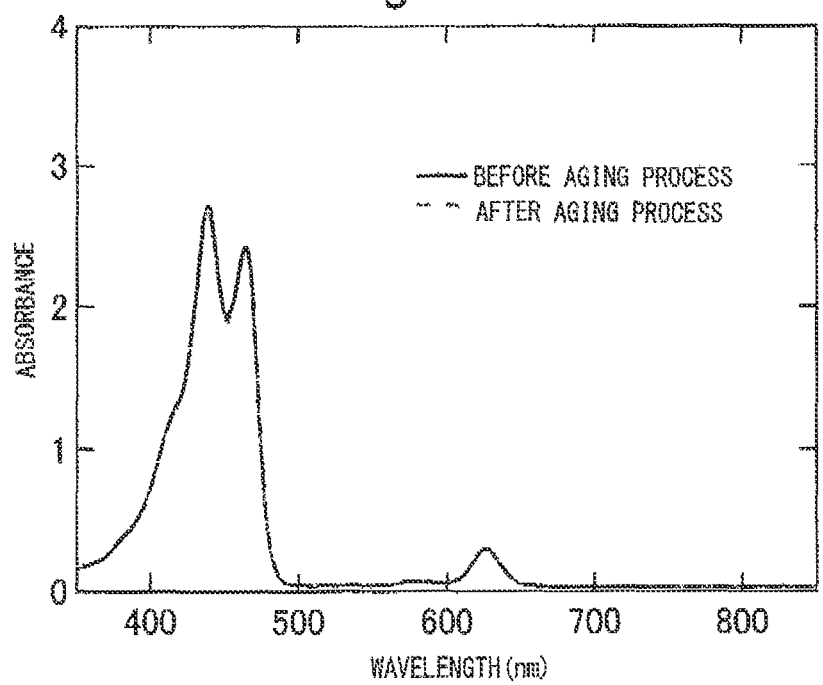
FIG. 12 illustrates the comparison of optical absorption spectra before and after the aging test of a light conversion element according to an embodiment of the present invention.
Figure 13:
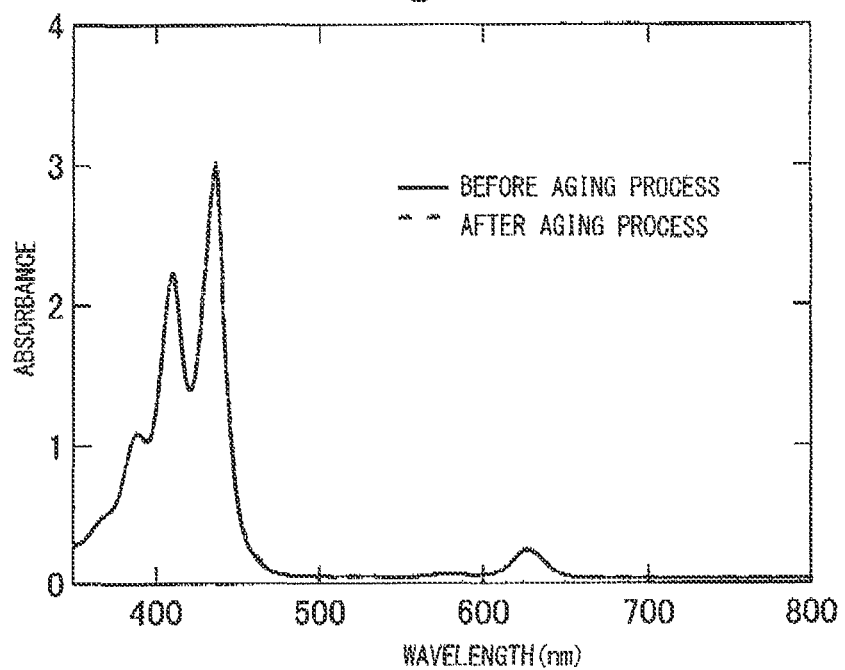
FIG. 13 illustrates the comparison of optical absorption spectra before and after the aging test of a light conversion element according to an embodiment of the present invention.
Figure 14:
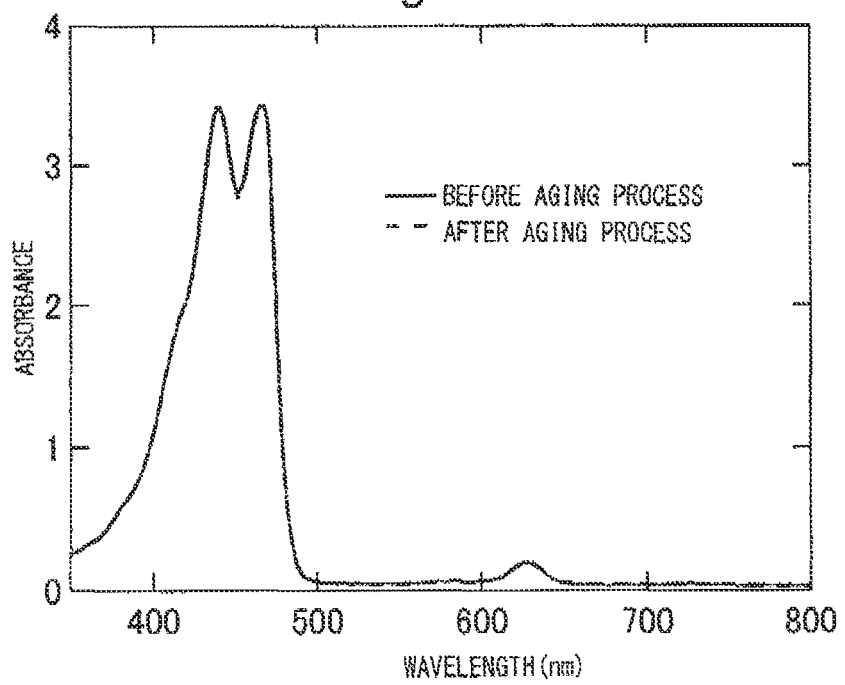
FIG. 14 illustrates the comparison of optical absorption spectra before and after the aging test of a light conversion element according to an embodiment of the present invention.
Figure 15:
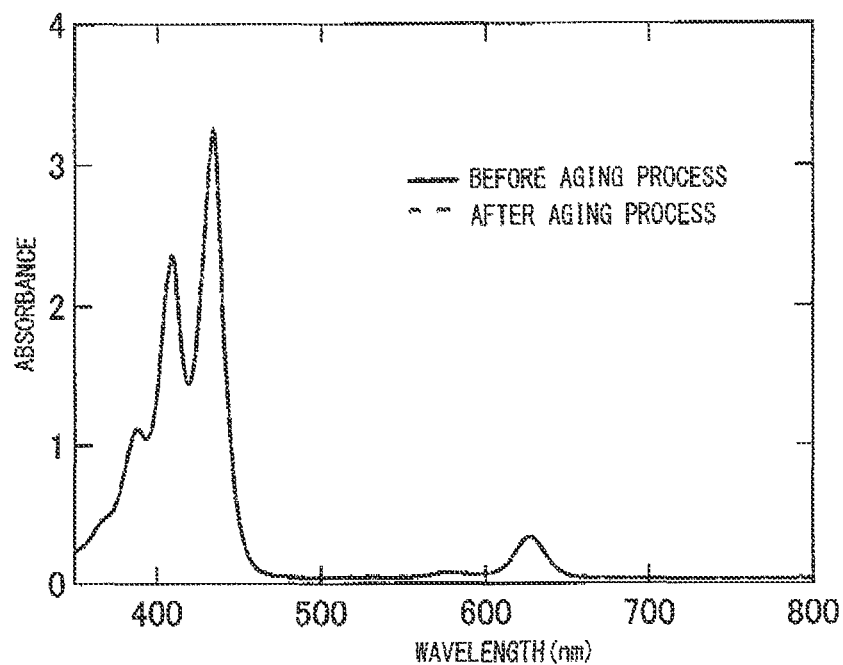
FIG. 15 illustrates the comparison of optical absorption spectra before and after the aging test of a light conversion element according to an embodiment of the present invention.
Figure 16:
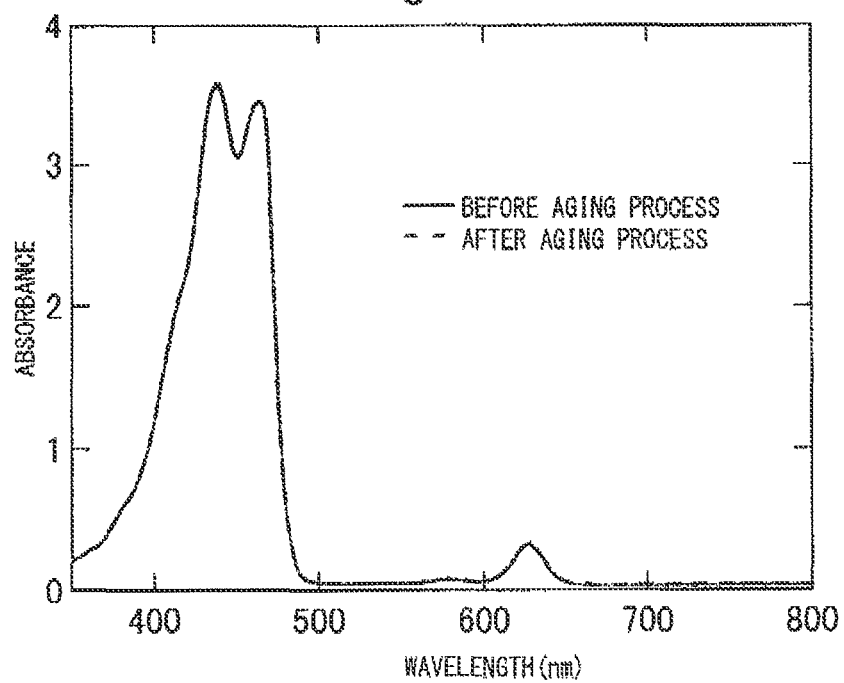
FIG. 16 illustrates the comparison of optical absorption spectra before and after the aging test of a light conversion element according to an embodiment of the present invention.
Figure 17:
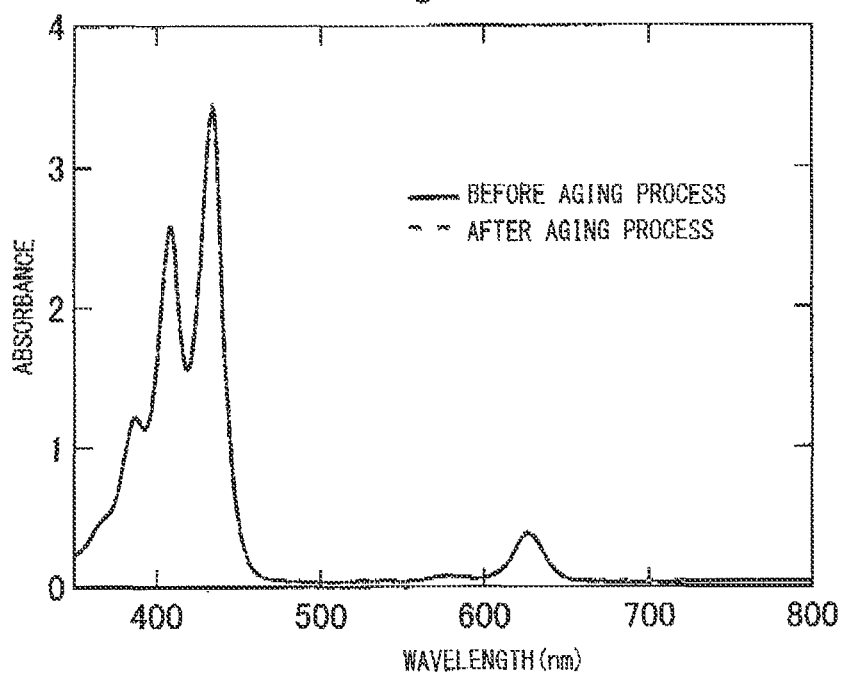
FIG. 17 illustrates the comparison of optical absorption spectra before and after the aging test of a light conversion element according to an embodiment of the present invention.
Figure 18:
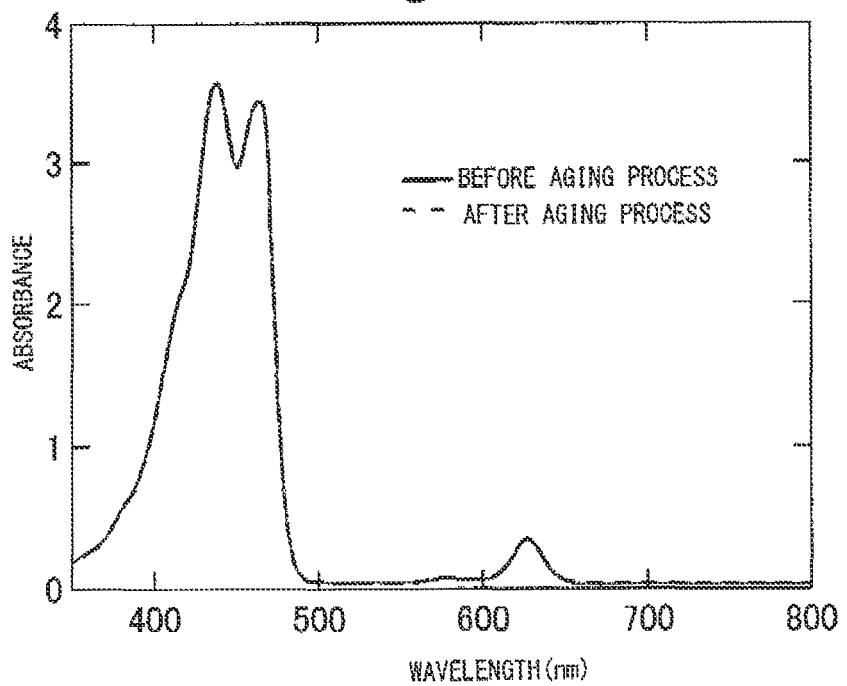
FIG. 18 illustrates the comparison of optical absorption spectra before and after the aging test of a light conversion element according to an embodiment of the present invention.
Figure 19:
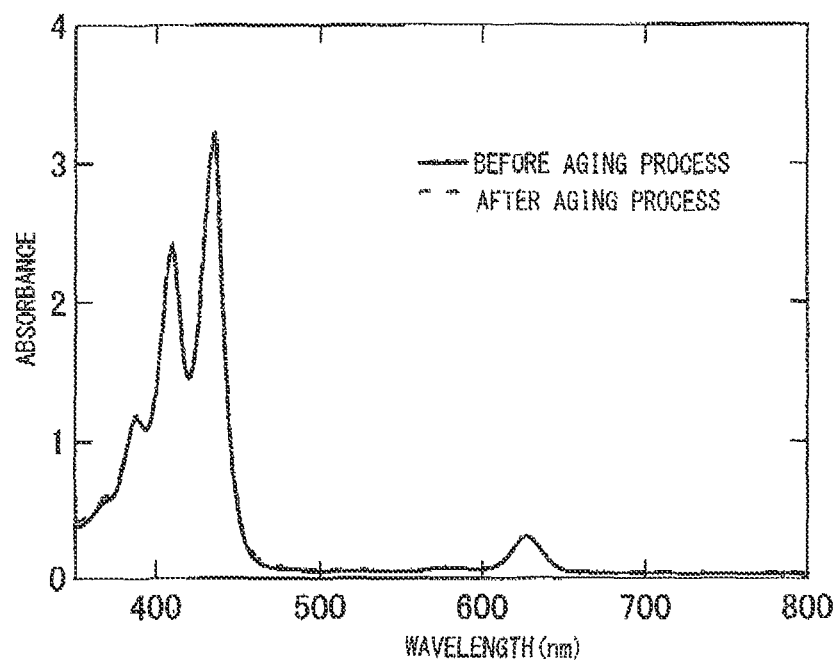
FIG. 19 illustrates the comparison of optical absorption spectra before and after the aging test of a light conversion element according to an embodiment of the present invention.
Figure 20:
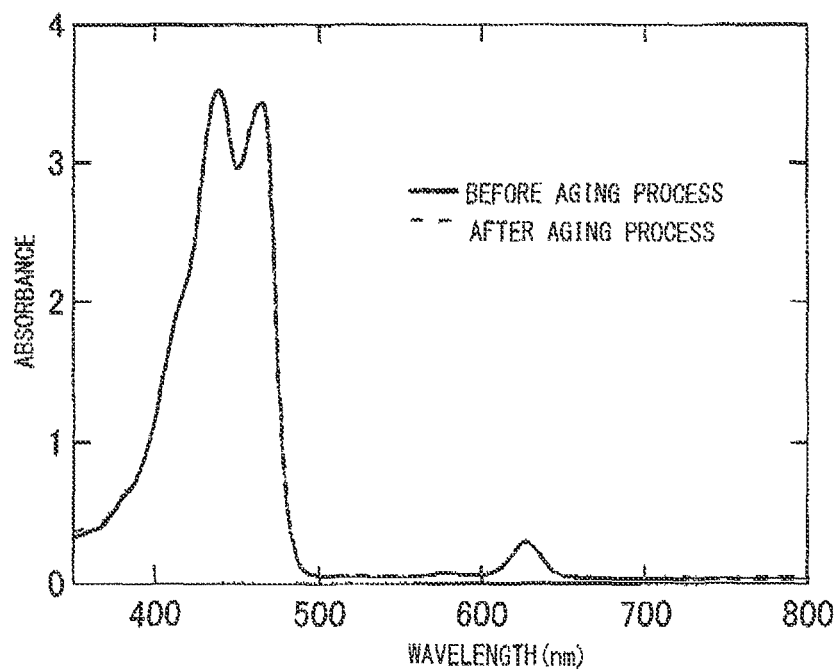
FIG. 20 illustrates the comparison of optical absorption spectra before and after the aging test of a light conversion element according to an embodiment of the present invention.

Furthermore, the figures of the emission spectra are shown for each of Working Examples 18-21 (in FIG. 8, (a) (the ionic liquid #1, the photosensitizing molecule #1, the light-emitting molecule #2), (b) (the ionic liquid #1, the photosensitizing molecule #1, the light-emitting molecule #2), (c) (the ionic liquid #1, the photosensitizing molecule #2, the light-emitting molecule #1), and (d) (the ionic liquid #1, the photosensitizing molecule #2, the light-emitting molecule #3)), Working Examples 22-25 (in FIG. 9, (a) (the ionic liquid #2, the photosensitizing molecule #1, the light-emitting molecule #1), (b) (the ionic liquid #2, the photosensitizing molecule #1, the light-emitting molecule #2), (c) (the ionic liquid #2, the photosensitizing molecule #2, the light-emitting molecule #1), and (d) (the ionic liquid #2, the photosensitizing molecule #2, the light-emitting molecule #3)), and Working Examples 26-29 (in FIG. 10, (a) (the ionic liquid #3, the photosensitizing molecule #1, the light-emitting molecule #1), (b) (the ionic liquid #3, the sensitizing molecule #1, the light-emitting molecule #2), (c) (the ionic liquid #3, the photosensitizing molecule #2, the light-emitting molecule #1), and (d) (the ionic liquid #3, the photosensitizing molecule #2, the light-emitting molecule #3)).

Working Examples 35 to 44

Confirmation of the Ion Term Stability of Solutions and/or Dispersions of Organic Photosensitizing Molecules And Organic Light-Emitting Molecules in an Ionic Liquid The samples of the Working Examples 1, 2, 5, 6, 9, 10 and 14-17 were subjected to the reduced-pressure treatment #2 instead of the reduced-pressure treatment #1, and the absorption spectra of the samples thus prepared were measured immediately after preparation, using a thin quartz cell with a light path-length of 1 mm at room temperature and room humidity. Thereafter, the samples were placed in a sealed container filled with an inert gas (argon), and then the container was subjected to an accelerated test (an aging test) in a temperature-controlled oven at 80° C., After the sealed container was maintained at 80° C. and room humidity for 100 hours and half (100.5 hours), the container was taken out of the high-temperature oven. After leaving it at room temperature and room humidity for additional 38 hours, the lid of the sealed container was opened, and immediately after it, the optical absorption measurements were carried out.

In any of the samples, the absorption spectrum did not change, confirming that the solutions and/or dispersions of the organic photosensitizing molecules and the organic light-emitting molecules in the ionic liquid are stable for a long time.

The absorption spectra data before and after the aging of the samples of Working Examples 1, 2, 5, 6, 9, and 14-17 are each shown in FIGS. 11-20.

Working Example 45

Confirmation of the Long Term Stability of Solutions and/or Dispersions of Organic Photosensitizing Molecules and Organic Light-Emitting Molecules in an Ionic Liquid (2)

Figure 21:
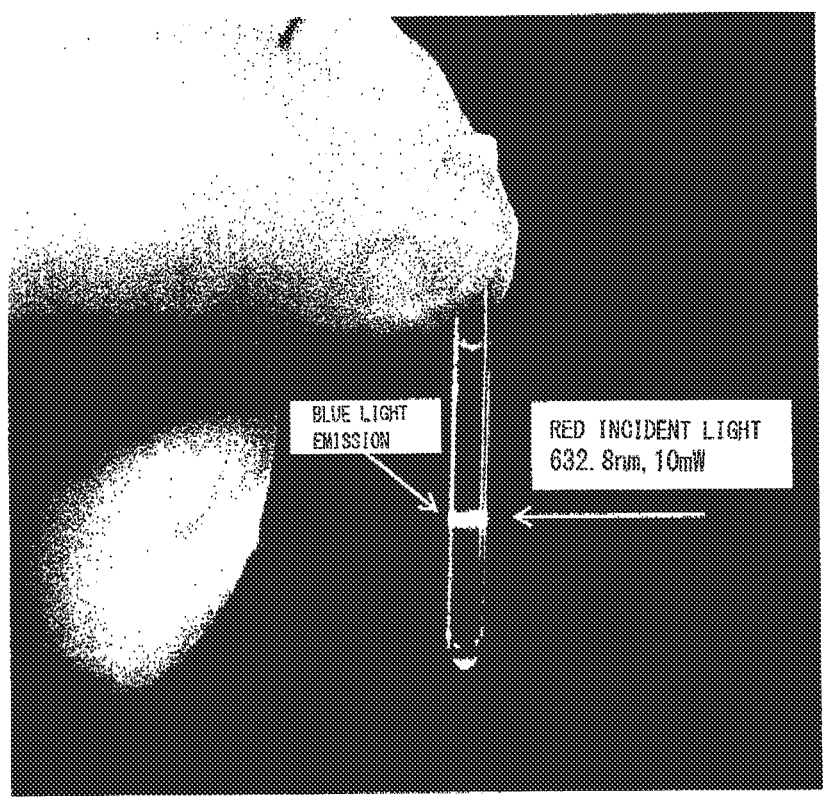
FIG. 21 is a photograph illustrating photon upconversion explained in Working Example 46, taken 10 months after fabrication, upon an irradiation of the continuous-wave laser emission #1.

A sample prepared by the reduced-pressure treatment #2, instead of the reduced-pressure treatment #1 used for the sample of Working Example 1, was injected into a quartz tube having a square cross section (inside dimension of 2 mm×2 mm, outside dimension of 3 mm×3 mm, and a length of 40 mm) to about ¾ of the entire length of the tube, in a stainless steel glove box filled with argon. Immediately thereafter, in the same glove box filled with argon, the open end of the quartz tube was sealed using a low melting point solder and a general-purpose soldering iron to prepare a test sample. This test sample was placed on a desk (in the air, at room temperature and room humidity) illuminated by an indoor fluorescent light for 10 months after the fabrication. When a continuous-wave laser emission #1 was irradiated after 10 months had elapsed since the fabrication, a bright blue upconverted light emission, which was visually the same as immediately after the fabrication, was seen in indoor condition with an indoor illumination on. A photograph (FIG. 21) (the ionic liquid #1, with the concentration of the organic photosensitizing molecule #1 of $5 \times 10^{-5}$M, the concentration of the organic light-emitting molecule #1 of $1 \times 10^{-3}$M, and with the continuous-wave laser emitting device #1) in which the test sample is performing photon upconversion at 10 months after the fabrication is shown.

From Working Examples 35-45, it was found that, when the ionic liquid has the "cation-π interaction" with the organic photosensitizing molecules and the organic light-emitting molecules and is water-immiscible, the light conversion element is stable for a long time.

Working Example 46

Measurement of Upconversion Quantum Yield 1

Using the continuous-wave laser emission #1, the quantum yield for the Working Example 13 was calculated. It was found that the upconversion quantum yield of about 1.6% was attained at an excitation intensity of 2 W/cm².

Procedure for Determining Upconversion Quantum Yield 1

First, in a glove box filled with argon, the sample and the reference were respectively injected into rectangular glass tubes up to about half of the entire length, said tube (manufacturer: Mitorika Glass, custom-made, Drawing No. EA0066) having the inside dimension of 2 mm×2 mm, outside dimension of 3 mm×3 mm, and the length of 40 mm with one end thereof were closed. Immediately thereafter, in the same glove box filled with argon, the open end of the rectangular glass tube was closed using a low melting temperature solder (melting point: 155° C., product name: Cerasolzer Eco #155, supplier: Eishin Industry Co., Ltd.) and a general-purpose soldering iron.

Herein, the sample is "the sample of Working Example in Table 1 fabricated by the procedure in Working Example 1," and the reference is a solution of the organic light-emitting molecule #2 (molar concentration: $1 \times 10^{-4}$ mol/l) in toluene.

The emitting quantum yield, when the solution of the organic light-emitting molecule #2 in benzene was excited at a wavelength of about 400 nm, was about 85% as described in an article (P. J. Hanhela and D. B. Paul, Australian Journal of Chemistry, vol. 31, pp. 553-559, 1984). Though there is a slight difference between benzene and toluene as solvents, it is often considered that the influence of this slight difference on the light emission quantum yield is not significant. For example, when the quantum yield of the sample was estimated in Non-patent document 5, a toluene solution of the organic light-emitting molecule #2 was used as the reference whose emission quantum, yield was set to be 55%, by which the quantum yield of the sample was determined (this point was described in the caption of FIG. 5 in the Non-patent document 5). Thus, the method for determining the quantum yield of the sample in the Working Examples of the present invention is basically the same as that adopted in the Non-patent document 5 except that the concentration of the organic light-emitting molecule 0.2 in the used reference was different.

In the Working Examples of the present invention, the continuous-wave laser emission #1 generated from the continuous-wave laser emitting device #1 was incident on a sample, and its emission spectrum was measured using the monochromator (described above) and the thermoelectrically cooled silicon CCD detector (described above). The measurement condition was: the entrance slit width of the monochromator=150 μm, the exposure time of the CCD detector=0.01 second.

Subsequently, a diode laser (spot diameter: about 1 mm, manufacturer: World Star Tech, product No. TECBL-30GC-405) with the wavelength of 405 nm was incident on a reference, and its emission spectrum was measured with the same measurement conditions as above.

Separately, the absorption spectra of the sample and the reference were measured using the UV-VIS near-infrared spectrophotometer (described above).

Based on the above measured data, the upconversion quantum yield of the sample can be determined by a method generally known to a person skilled in the art. The definition of upconversion quantum yield in the Examples of the present invention is such that the yield is 100% when one upconverted photon is always generated from two incident photons.

In Background Art, the Non-patent document 4 which employed styrene oligomer as the medium was mentioned as a precedent example. In this example, the maximum upconversion quantum yield was about 3.2% at an excitation intensity of about 14 W/cm$^2$. It is known that, in photon upconversions based on the TTA process, the quantum yield changes in proportion to the square of excitation intensity (as described in FIG. 5 of Non-patent document 2). The excitation intensity of the continuous-wave laser emission #1 in the Working Example 46 of the present invention was about 2 W/cm$^2$, which was about one-seventh of the excitation intensity in the Non-patent document 4. Thus, if the excitation intensity in the Non-patent document 4 was about one-seventh thereof (to become comparable to the excitation intensity used in the Example of the present invention), it can be deduced that the upconversion quantum yield would have been about 3.2%÷7÷7=0.065%. The value in the case of the upconversion in the Example (Working Example 46) of the present invention, i.e. about 1.6%, far exceeds this value of the precedent example. It is believed that the reason for such difference was partly because of the styrene oligomer being a highly viscous medium.

It should be emphasized here that, as for the sample in the Working Example 46 of the present invention, no search for the optimum condition to maximize the quantum yield had been made yet. Thus, the "sample of Working Example 1 in Table 1 prepared in the procedure of Working Example 1" for which the upconversion quantum yield was determined, was a sample in which the optimization of the condition for maximizing the upconversion quantum yield (i.e., search for the optimum concentrations of the photosensitizing molecule and the light-emitting molecule) had not been made yet. This indicates that, if an optimization of the condition for maximizing the upconversion quantum yield would have been made for the sample of Working Example 46 of the present invention as well, an upconversion quantum yield much higher than the quantum yield obtained by using the styrene oligomer as the medium in the precedent example (Non-patent document 4) would have been obtained. It was, therefore, found that the embodiment of the present invention can provide an upconversion quantum yield that is largely progressed from the precedent example (Non-patent document 4).

Working Examples 47 to 50

Dissolution and/or Dispersion Tests where the Type of Volatile Organic Solvent was Varied For the ionic liquid #1 (Working Example 47), the ionic liquid #2 (Working Example 4), the ionic liquid #3 (Working Example 49), and the ionic liquid #5 (Working Example 50), the same operation as that in Working Example 1 was performed except that benzene was used instead of toluene, and as a result, visually homogeneous-and-transparent single-layered solutions and/or dispersions similar to the Working Example 1 were obtained.

Working Examples 51 to 53

Tests for Confirming Light Conversion by the Light Conversion Elements

The same operation as that in Working Example 1, except that the ionic liquids shown in Table 3 below were employed, was performed, and as a result, visually homogeneous-and-transparent single-layered solutions and/or dispersions were obtained.

TABLE 3

|  | Working Example | | |
|---|---|---|---|
|  | 51 | 52 | 53 |
| Ionic liquid | #7 | #8 | #9 |
| Organic photosensitizing molecule | #1 | #1 | #1 |
| Organic light-emitting molecule | #1 | #1 | #1 |

Working Example 54 and 56

Upon irradiations of continuous-wave laser light onto samples, which were carried out under the same condition as that in the Working Example 18 except that the samples and the continuous-wave laser emissions in Working Examples 51 to 53 shown in Table 4 below were used, bright blue upconverted light emissions were visually and sufficiently recognized under indoor condition with room illumination on.

TABLE 4

|  | Working Example | | |
|---|---|---|---|
|  | 54 | 55 | 56 |
| Working Example No. of the sample used | 51 | 52 | 53 |
| Continuous-wave laser emission | #3 | #3 | #3 |

Procedure for Determining Upconversion Quantum Yield 2

First, a quartz tube (manufacturer: VitroCom, product No. QA101) with a square cross-section (inside dimension: 1.0 mm×1.0 mm, outside dimension: 2.0 mm×2.0 mm) was cut into a length of 25 mm, and after washing, one end thereof was closed with a burner to form a quartz tube with the one end closed, which is to be used in the quantum yield measurement. Subsequently, in a stainless steel vacuum glove box (manufacturer: UNICO, product No. UN-650F) filled with argon gas, a sample liquid was injected into the above one-end-closed quartz tube up to about ¾ of the entire length, and then the open end of the quartz tube was closed in a manner similar to the above "Procedure for determining upconversion quantum yield 1", to form a sample for measurements. In the present section of "Procedure for determining upconversion quantum yield 2", a solution of the organic light-emitting molecule #2 in toluene (molar concentration: 1×10$^{-5}$ mol/l) was used as the reference liquid.

In order to determine and reproduce the spatial position of the sample quartz tube with high precision, the sample quartz tube was held by a custom-made stainless steel holder that was mounted on a stainless steel XYZ stage (manufacturer: Suruga Seiki Co., Ltd., product No. BSS76-40C), whose XYZ positions were precisely determined by manual micrometers. The test quartz tubes containing the sample and the reference were irradiated with the continuous-wave laser emitting device #3 and the continuous-wave laser emitting device #4, respectively. The beam spot diameter at the position of the quartz tube was about 0.8 mm when measured with a CCD laser beam profiler. After the emission from the test quartz tube was collimated with a lens, it was refocused with another lens onto the slit of a 30 cm diffraction grating monochromator (manufacturer: PI Acton, product No. SP2300). The emission spectra obtained were corrected for the wavelength dependence of the diffraction grating and for the wavelength dependence of the thermoelectrically cooled arrayed CCD detector (manufacturer: Princeton Instruments, product No. PIXSIS: 100BR) used. Together with this, the optical absorption spectra of the sample liquid and the reference liquid held in a 1 cm-thick quartz cuvette (manufacturer: Starna, product No. Type53/Q/1) were measured with a UV-VIS near-infrared spectrophotometer. Since the emission quantum yield of this reference liquid is known to be about 85%, as already described in the section that described the emission quantum yield determined from the benzene solution of the organic light-emitting molecule #2 upon excitation around 400 nm, based on this, the magnitude of upconversion quantum yield of the sample was calculated.

Working Examples 57 to 64

Measurement of Upconversion Quantum Yield 2

Table 5 shows the values of upconversion quantum yield calculated by using the above "Procedure for determining upconversion quantum yield 2" based on the results of measurements in which the organic photosensitizing molecule #1 at a concentration of $1\times10^{-5}$ (mol/l), the organic light-emitting molecule #1 at a concentration of $3\times10^{-3}$ (mol/l), and the ionic liquids #1, #3, #6, #7, #8, #2, #9, and #5, were used.

TABLE 5

| Working Example | 57 | 58 | 59 | 60 | 61 | 62 | 63 | 64 |
|---|---|---|---|---|---|---|---|---|
| Ionic Liquid | #1 | #3 | #6 | #7 | #8 | #2 | #9 | #5 |
| Quantum yield (%) | 3.3 | 4.4 | 5.2 | 4.2 | ≈1 | ≈1 | 10.6 | 2.5 |

In an embodiment of the present invention, as shown by the result of the above "Measurement of upconversion quantum yield 2" (Table 5), a considerable improvement in the values of upconversion quantum yield from the upconversion quantum yield values measured with continuous-wave excitations reported in the previous documents (Non-patent document 1, Non-patent document 4, and Non-patent document 5) has been attained.

The definition of upconversion quantum yield in the Examples of the present invention is such that the yield is 100% when one upconverted photon is always produced from two incident photons. Currently, there are two definitions of upconversion quantum yield being used among those skilled in the art: One is the definition used in the Examples of the present invention (the maximum is 100%), and the other defines the case where one upconverted photon is always produced from two incident photons as 50%. According to the latter definition, the maximum value of the upconversion quantum yield is 50%, and such a definition was adopted in Non-patent document 5, etc.

Figure 7:
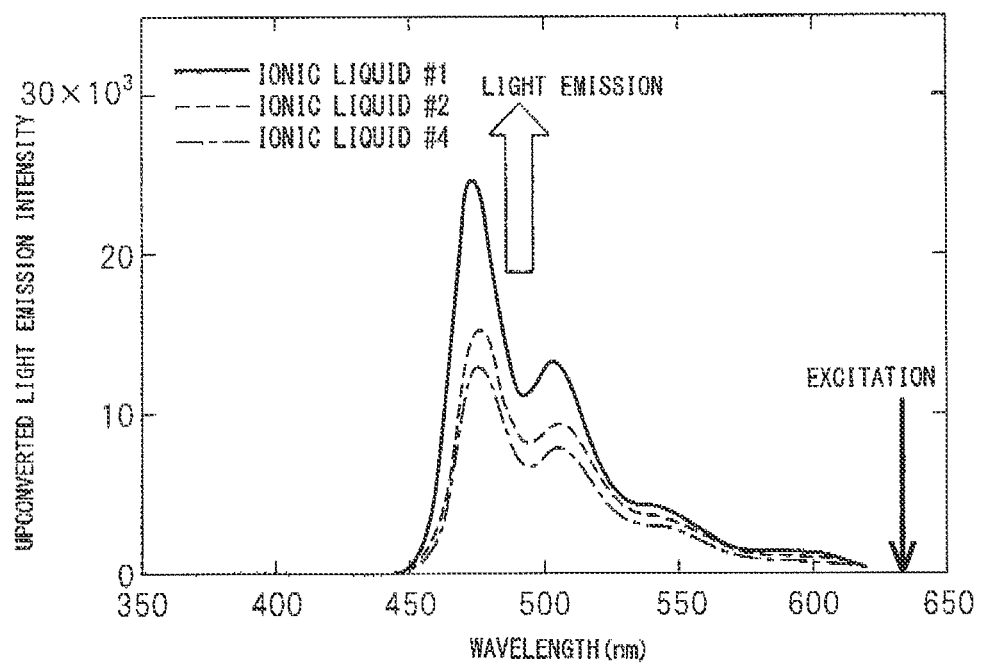
FIG. 7 illustrates the spectra of upconverted light emitted from samples in which organic photosensitizing molecules and organic light-emitting molecules according to an embodiment of the present invention were dissolved and/or dispersed in three different ionic liquids.

In an embodiment of the present invention, as shown by the above result of measurement of the upconversion quantum yield (Table 5), the maximum quantum yield of about 10% has been attained. The examples (working Examples 57-64) in the Table 5 were conversion from 632.8 nm (excitation wavelength) to 475 nm (peak wavelength of the upconverted emission spectrum, FIG. 7). Thus, when the energy upshift amount $\Delta E$ (eV) is defined as the difference between the photon energy at the peak wavelength of the upconverted emission spectrum and the photon energy at the excitation wavelength, the Table 5 shows the result of upconversion with the energy upshift of $\Delta E=1240/475-1240/632.8=0.65$ eV.

It is not necessarily easy to compare the values of the upconversion quantum yield measured in an embodiment of the present invention (the maximum thereof is about 10%, Table 5) with the values of upconversion quantum yield reported in previous examples, since various conditions, such as the measurement condition of the quantum yield and the magnitude of the energy upshift ($\Delta E(eV)$) etc., are different between the examples, and also since attempts to achieve greater $\Delta E$ tend to result in lower upconversion quantum yield. However, when a comparison is attempted for the purpose of giving a rough estimate, Non-patent document 1 indicated "Solvent: not clearly described but surmised to be benzene or toluene, $\Delta E$: about 0.43 eV, quantum yield: 2% or more," Non-patent document 5 indicated "Solvent: toluene, $\Delta E$: about 0.65 eV, quantum yield: 6.4%," Non-patent document 10 indicated "Solvent: toluene, $\Delta E$: about 0.6 eV, quantum yield: 2.4%," one embodiment of Non-patent document 11 indicated "Solvent: benzene, $\Delta E$: about 0.2 eV, quantum yield: about 15%," another embodiment of Non-patent document 11 indicated "Solvent: benzene, $\Delta E$: about 0.4 eV, quantum yield: about 6%," and Non-patent document 12 indicated "Solvent: benzene, $\Delta E$: about 0.8 eV, quantum yield: about 1%." These quantum yields are the values that have been adjusted to the definition employed in the Examples of the present invention described above (the maximum value thereof is 100%). As mentioned above, it is difficult to simply compare the values of quantum yields among different previous examples owing to factors such as that the greater $\Delta E$ tend to result in the smaller upconversion quantum yield, and that the various conditions are different among these examples, Nevertheless, the value observed in the Working Example (Table 5) of the present invention ($\Delta E$: about 0.65 eV, quantum yield: about 10%) is at least not inferior to those values reported in the previous examples, and rather, if the magnitude of $\Delta E$ is taken into account in the comparison, it is even superior to those values reported in the previous examples.

Figure 22:
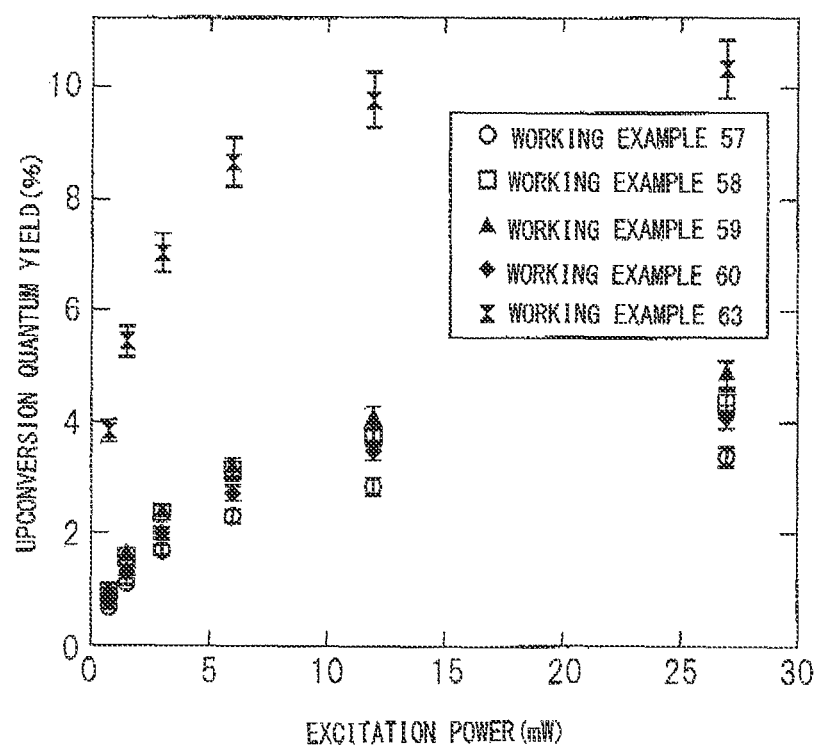
FIG. 22 illustrates the dependence of the upconversion quantum yields on the power of the excitation using the continuous-wave laser emitting device #3, for Working Examples 57, 58, 59, 60, and 63.

Furthermore, regarding the Working Examples 57, 58, 59, 60, and 63, the dependence of the upconversion quantum yield on the excitation intensity was measured using the continuous-wave laser emitting device #3 (see [FIG. 22]). As shown, for all the cases, the values of the upconversion quantum yield converged toward respective constant values as the excitation intensity increased. The independence of the upconversion quantum yield on the excitation intensity means that nearly all of the excited triplet states formed have found a partner of triplet-triplet annihilation within the lifetime of the excited state, which is an evidence that the diffusion of the organic molecules and energy transfer between the organic molecules are taking place at sufficiently high rates in the medium (ionic liquid). If there remains meaningful amount of oxygen molecules etc. that efficiently quench excited triplet states (i.e. non-radiative decay into the ground state) in the medium, non-negligible fraction of the organic molecules in the excited triplet state would collide with oxygen molecules and quench into the ground state before they could find a partner of the triplet-triplet annihilation. Under such an inefficient situation, the value of upconversion quantum yield would increase proportionately to the concentration of the excited triplet state formed, i.e., to the excitation intensity. Namely, in FIG. 22, the observed convergence of the upconversion quantum yields toward constant values despite the relatively weak excitation intensity of 30 mW or less means that the diffusion of the organic molecules and energy transfer between the organic molecules are taking place at sufficiently high rates within the ionic liquid. Such desirable characteristics are considered to have been realized by an achievement of easy removal of oxygen molecules that rapidly quench excited triplet states. This has been made possible by an employment of ionic liquids that possess extremely low vapor pressures as the media, which resultantly allowed for a direct evacuation of the sample liquids using a turbo molecular pump. From this viewpoint, the use of ionic liquids as the medium has an advantage that did not exist previously. This is because such the direct degassing using a turbo molecular pump cannot be applied to the conventional samples that employed volatile solvents.

Furthermore, in order to reinforce the description in the above paragraph, an original analytical model was introduced in an embodiment of the present invention. Equation 1 is a dimensionless equation that represents the relationship between excitation intensity and upconversion quantum yield.

[Mathematical 1]

$$\Theta = 1 + \frac{1 - \sqrt{1+2\Lambda}}{\Lambda} \left( \Leftrightarrow \frac{\theta}{\varepsilon\phi} = 1 + \frac{1 - \sqrt{1+2\alpha N_{ex}}}{\alpha N_{ex}} \right) \quad \text{(Equation 1)}$$

wherein, $0 \leq \theta \leq 1$ and $0 \leq \Lambda \leq \infty$, and these variables are defined as

[Mathematical 2]

$$\Theta \equiv \frac{\theta}{\varepsilon\phi}, \Lambda \equiv \alpha N_{ex}, \alpha \equiv \frac{4k_{TTA}}{k_{T(E)}^2} \quad \text{(Equation 2)}$$

Figure 23:
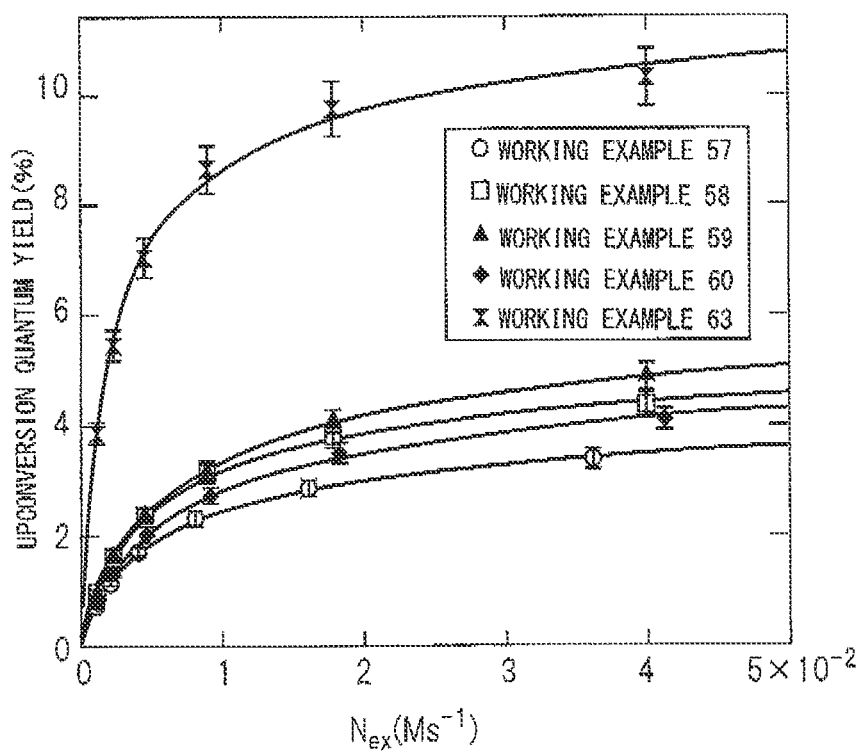
FIG. 23 illustrates plots of the experimental data expressed with the abscissa of FIG. 22 converted into Ne and with fitting curves given by Equation 1.
Figure 24:
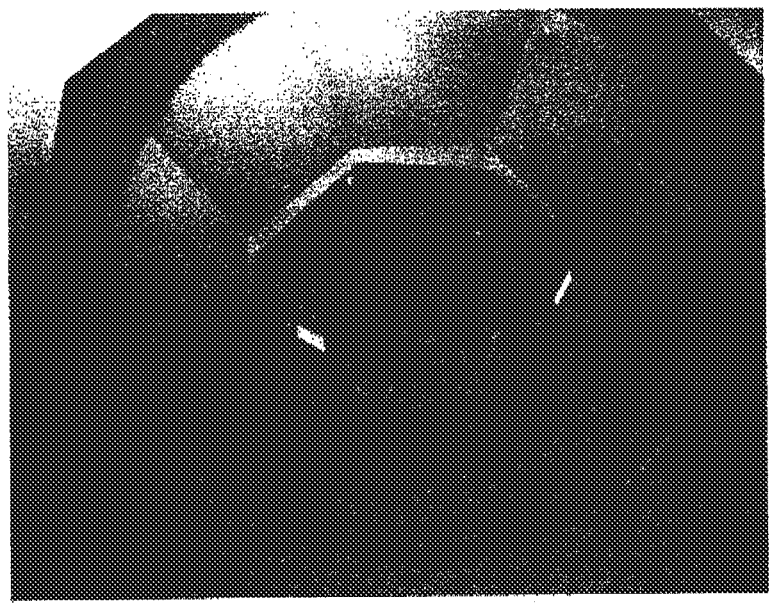
FIG. 24 illustrates even at 10 hours after organic photosensitizing molecules and organic light-emitting molecules were sprinkled as powders directly over an ionic liquid without using volatile organic solvents, showing that no spontaneous dissolution or dispersion thereof into the ionic liquid occurs. The dark colored powders (black in the black and white printing) are the organic photosensitizing molecules and the light colored powders (gray in the black and white printing) are the organic light-emitting molecules.

Variables in Equation 2 are as follows. $\theta$: upconversion quantum yield, $\varepsilon$: emission quantum yield of an organic light-emitting molecule from the lowest excited singlet level, $\phi$: the probability that the singlet state is generated as a result of the triplet-triplet annihilation, $N_{ex}$: the rate of photons (represented in molar) absorbed by organic sensitizing molecules (unit: M s$^{-1}$), $k_{TTA}$: the rate of the triplet-triplet annihilation (unit: M$^{-1}$ s$^{-1}$), $k_{T(E)}$: the rate of the spontaneous decay of the organic light-emitting molecules from the lowest triplet level into the ground state (unit: s$^{-1}$), and $0 \leq \theta \leq 1$, $0 \leq \varepsilon \leq 1$, and $0 \leq \phi \leq 1$. Equation 1 is an analytical equation derived by assuming that the rate of the collision and energy transfer between the organic molecules is sufficiently high. FIG. 23 shows the experimental data plots, which is the re-display of FIG. 22 with the abscissa modified into $N_{ex}$, along with fitting curves given by the Equation 1 to them. The model (Equation 1), which was derived by assuming sufficiently high rate of the intermolecular energy transfer, agrees well with the experimental results, by which it was confirmed that the convergence of the upconversion quantum yields toward respective constant values observed in FIG. 22 originated from a sufficiently high rate of the collision and energy transfer between the organic molecules.

Comparative Example 1

Dissolution Test of Organic Photosensitizing Molecules and Organic Light-Emitting Molecules into an Ionic Liquid Without Using a Volatile Organic Solvent At room temperature, about 0.5 g of the ionic liquid #1 was held in a quartz mortar. Next, the powder of about 0.5 mg of the organic photosensitizing molecule #1 and about 1 mg of the organic light-emitting molecule #2 were sprinkled thereon, and left for about 6 hours. The above organic photosensitizing molecule #1 remained in the state of powder with dark-green color floating on the ionic liquid #1, and the above organic light-emitting molecule #2 remained in the state of powder with yellow-orange color also floating on the ionic liquid #1. Subsequently, they were left for about 4 hours at room temperature, but no changes in the states of the above organic photosensitizing molecules and the organic light-emitting molecules were observed.

Comparative Example 2

Dissolution/Dispersion Test in an Ionic Liquid by Means of Grinding in a Mortar

The above organic photosensitizing molecules and the above organic light-emitting molecules of Comparative Example 1 were ground with a quartz pestle for about 30 minutes. The ionic liquid was visually colored, and became an inhomogeneous dispersion in which solid powders were floating on the surface and inside of the liquid. This was inspected with an optical microscope at a 50-fold magnification, and it was found that the majority of the above organic photosensitizing molecules and the above organic light-emitting molecules remained fine solid powders.

Comparative Example 3

Dissolution/Dispersion Test in an Ionic Liquid by Means of Ultrasound Sonication After the powder of the organic photosensitizing molecule and the organic light-emitting molecule was sprinkled in the Comparative Example 1, further dispersion was attempted by using an ultrasound sonicator for about 30 minutes. However, while the ionic liquid was visually slightly colored, it was still an inhomogeneous dispersion in which solid powders were floating on the surface and inside of the liquid.

It was revealed that, unless dissolved in a volatile organic solvent, the organic photosensitizing molecule #1 and the organic light-emitting molecule #2 do not homogeneously dissolve/disperse in the ionic liquid #1 even if the stirring according to the present invention was carried out.

Comparative Examples 4 to 7

Dissolution/Dispersion Test in an Ionic Liquid Having an Anion that Imparts Water Miscibility to the Ionic Liquid When the same procedure as that in Working Example 1 was followed, except that the ionic liquid #10 (Comparative Example 4), the ionic liquid #11 (Comparative Example 5), the ionic liquid #12 (Comparative Example 6) and the ionic liquid 413 (Comparative Example 7) were employed instead, while some amount of the organic light-emitting molecule #1 (yellow) appeared to have moved into the ionic liquid layer, the majority of the organic photosensitizing molecule #1 (green) by visual, inspection remained in the toluene solution which formed the upper layer, where the layer separation is still visually accompanied between the ionic liquid and the toluene solution of the organic molecules. From this, it was confirmed that, in the reduced-pressure process (the process of removing volatile organic solvent), the organic photosensitizing molecule and the organic light-emitting molecule cannot be visually homogeneously dissolved/dispersed in the ionic liquid without accompanying separation of the solids of these molecules.

Comparative Examples 4-7 have indicated that the organic photosensitizing molecule #1 and the organic light-emitting molecule #1 cannot be visually homogeneously dissolved/dispersed in the ionic liquids #10-#13 by the procedure regarding the Working Example 1, when the ionic liquids #10-#13 possessing anions that impart water miscibility to the ionic liquid are employed.

Comparative Examples 8 to 13

Dissolution/Dispersion Test in an Ionic Liquid Having an Anion that Imparts Water Immiscibility to the Ionic Liquid When the same procedure as the step 1 and step 2 of the Working Example 1, except that n-hexane (in which no organic light-emitting molecule #1 nor organic photosensitizing molecule #1 were dissolved) was used as the volatile organic solvent, was carried out for the ionic liquids #1, #2, #3, #5, and #6, it was visually confirmed that n-hexane and the water-immiscible ionic liquid gave rise to a complete layer separation without mixing with each other at all. It has been suggested that the "cation-π interaction" is meaningfully playing a role in these ionic liquids used in the embodiments of the present invention, based on such the experimental result that nonpolar solvent n-hexane did not mix visually at all, while benzene and toluene, which are also nonpolar solvents but have it electrons, can mix.

Comparative Examples 14 to 21

Comparison Test on the Miscibilities of the Water-Immiscible Ionic Liquids in an Embodiment of the Present Invention and Two Nonpolar Solvents (Benzene and Cyclohexane)

Figure 25:
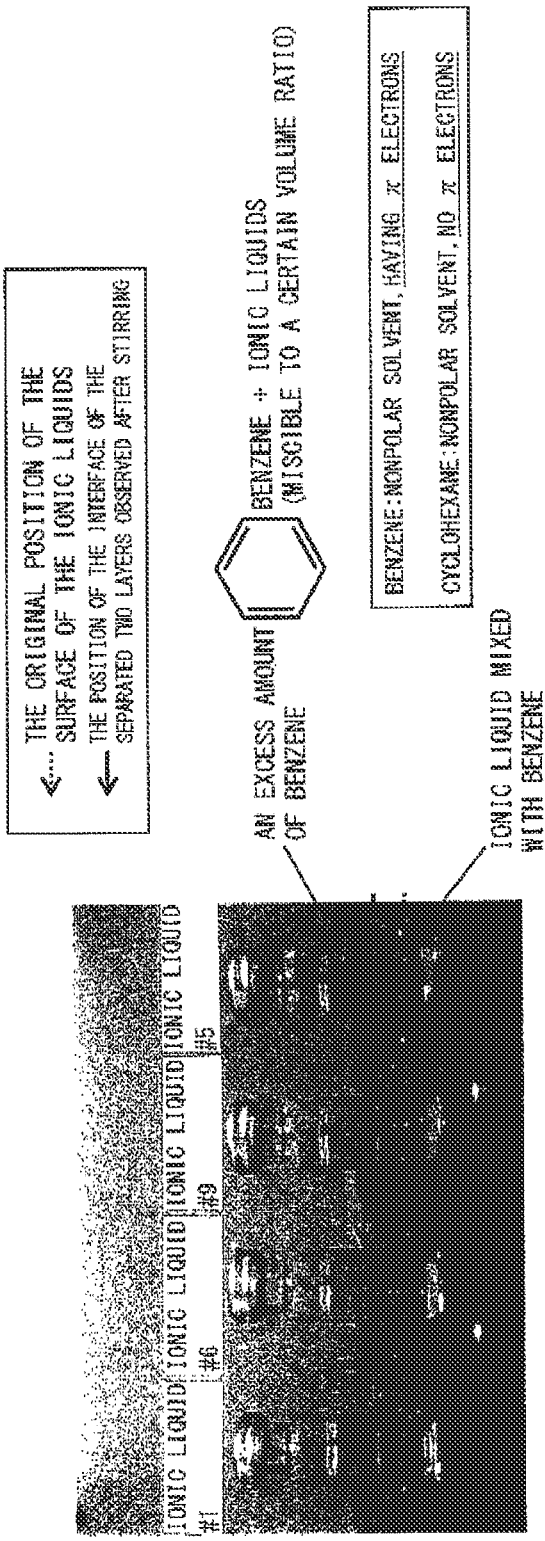
FIG. 25 is a photograph showing the miscibility of water-immiscible ionic liquids according to an embodiment of the present invention and non-polar solvent benzene ($C_6H_6$).
Figure 26:
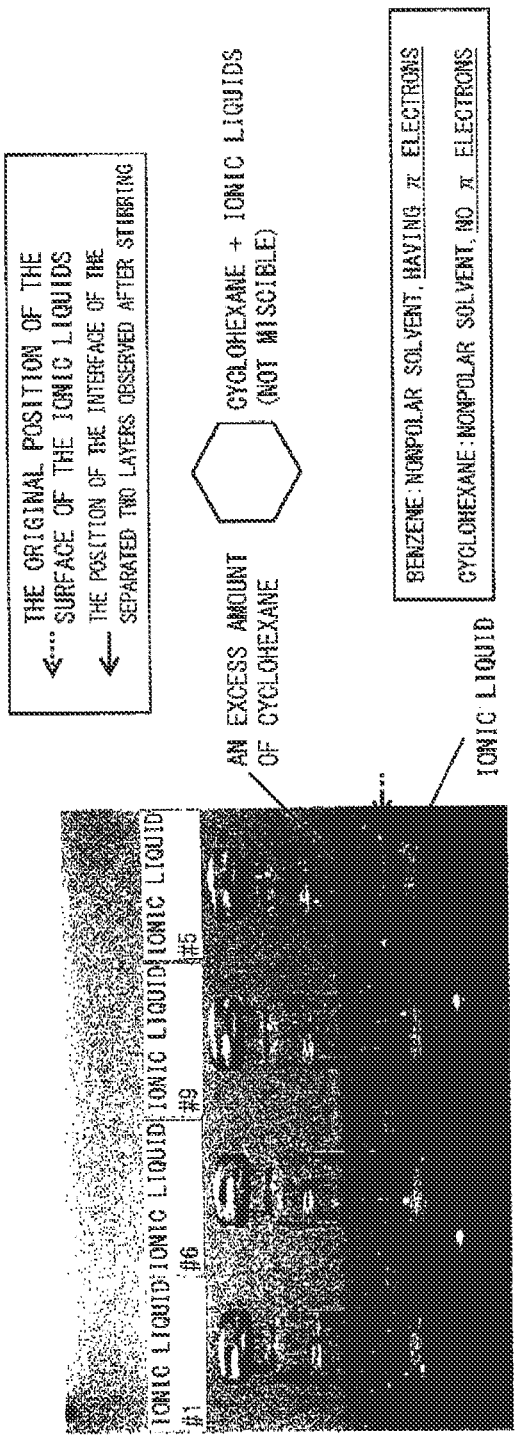
FIG. 26 is a photograph showing the miscibility of water-immiscible ionic liquids according to an embodiment of the present invention and non-polar solvent cyclohexane ($C_6H_{12}$).

Experiments were performed in which the miscibilities of the water-immiscible ionic liquids #1, #5, #6, and #9 in an embodiment of the present invention and two nonpolar solvents, benzene ($C_6H_6$) (Comparative Examples 14-17) and cyclohexane ($C_6H_{12}$) (Comparative Examples 18-21) were compared. In order to investigate the combinations of these four ionic liquids with two nonpolar solvents, eight glass vials (capacity: about 1.5 ml), which can be conveniently sealed with a silicone-rubber cap, were used. To each of the first four vials, 300 μl of the ionic liquids #1, #5, #6, and #9 were added at first, and then excess amounts (>1 ml each) of benzene was added. To each of the remaining four vials, 300 μl of the ionic liquids #1, #5, #6, and #9 were added as first, and then excess amounts (>1 ml each) of cyclohexane was added. After these eight glass vials were sealed with the silicone-rubber caps, they were shaken well by a hand to stir for about 1 minute. The photographs of the glass containers after the shaking are shown in FIG. 25 and FIG. 26. In these figures, the dashed arrows indicate the original positions of the surface of the ionic liquids and the solid arrows indicate the positions of the interface between the separated two layers found after the stirring. In the case of benzene, the positions of the interface of the separated two layers observed after the stirring (solid arrows) came above the original surface positions of the ionic liquids (dashed arrows), indicating that these ionic liquids mixed with benzene up to certain volume ratios (FIG. 25). However, in the case of cyclohexane, which is also nonpolar solvent but does not possess π electrons, the positions of the interface of the separated two layers observed after the stirring (solid arrows) coincided with the original surface positions of the ionic liquids (dashed arrows), indicating that no mixing occurred (FIG. 26). This result unambiguously shows that the interaction with these ionic liquids is dominated by the classification of presence/absence of π electrons, and not by the classification of polar/nonpolar. From this experimental result that benzene, which is a nonpolar molecule but has a electrons, can go inside the ionic liquid, it has been strongly suggested that the "cation-π interaction" is meaningfully working in these ionic liquids according to an embodiment of the present invention.

INDUSTRIAL APPLICABILITY

The light conversion element according to the present invention can stably upconvert light for a long time, and thus can be widely used in the light-utilizing energy-related fields including solar cells, photocatalysts, photocatalytic hydrogen/oxygen generating devices, and the like.

EXPLANATION OF SYMBOLS

1: Photovoltaic layer
2: Transparent backside electrode
3: Transparent insulating film
4: Upconversion film layer
5: Light-reflecting film
6: Incident light

The invention claimed is:

1. A visually homogeneous and transparent light conversion element, wherein organic photosensitizing molecules and organic light-emitting molecules, which are a combination that exhibits a triplet-triplet annihilation process, are dissolved and/or dispersed in an ionic liquid.

2. The light conversion element according to claim 1, wherein said ionic liquid has the cation-π interaction with the organic photosensitizing molecule and the organic light-emitting molecule and is water-immiscible.

3. The light conversion element according to claim 1, wherein an anion in said ionic liquid is one or more selected from the group consisting of $[N(SO_2CF_3)_2]^-$, $[C(SO_2CF_3)_3]^-$, $[PF_6]^-$, $[(C_2F_5)_3PF_3]^-$, and $[BR_1R_2R_3R_4]^-$ ($R_1$, $R_2$, $R_3$, and $R_4$ are independently $CH_3(CH_2)_n$ (wherein, n=1, 2, 3, 4, 5, 6, 7, 8, and 9) or aryl).

4. The light conversion element according to claim 1, wherein a cation in said ionic liquid is one or more selected from the group consisting of a imidazolium cation, a pyridinium cation, a piperidinium cation, a pyrrolidinium cation, a pyrazolium cation, a thiazolium cation, a quaternary ammonium cation, a quaternary phosphonium cation, and a sulfonium cation.

5. The light conversion element according to claim 1, wherein said solution and/or said dispersion are/is stable for a long time.

6. The light conversion element according to claim 1, wherein its viscosity at 300K is 0.001 Pa·s or more and 1000 Pa·s or less.

7. A solar cell using the light conversion element according to claim 1.

8. A photocatalyst using the light conversion element according to claim 1.

9. A photocatalytic hydrogen/oxygen generating devices using the light conversion element according to claim 1.

10. A method for producing a visually homogeneous and transparent light conversion element, said method comprising the steps of:
    a) forming an organic solution or organic solutions in which organic photosensitizing molecules and organic light-emitting molecules, which are a combination that exhibits a triplet-triplet annihilation process, are dissolved in a volatile organic solvent or volatile organic solvents,
    b) mixing an ionic liquid with said volatile organic solution(s) by stirring to form a visually homogeneous and transparent solution and/or dispersion, and
    c) removing the volatile organic solvent(s) under reduced pressure from said solution and/or said dispersion to a trace amount or less.

11. The method according to claim 10, wherein said ionic liquid has the cation-π interaction with the organic photosensitizing molecule and the organic light-emitting molecule and is water-immiscible.

12. The method according to claim 10, wherein an anion in said ionic liquid is one or more selected from the group consisting of $[N(SO_2CF_3)_2]^-$, $[C(SO_2CF_3)_3]^-$, $[PF_6]^-$, $[(C_2F_5)_3PF_3]^-$, and $[BR_1R_2R_3R_4]^-$ ($R_1$, $R_2$, $R_3$, and $R_4$ are independently $CH_3(CH_2)_n$ (wherein, n=1, 2, 3, 4, 5, 6, 7, 8, and 9) or aryl).

13. The method according to claim 10, wherein a cation in said ionic liquid is one or more selected from the group consisting of an imidazolium cation, a pyridinium cation, a piperidinium cation, a pyrrolidinium cation, a pyrazolium cation, a thiazolium cation, a quaternary ammonium cation, a quaternary phosphonium cation, and a sulfonium cation.

14. The method according to claim 10, wherein its viscosity at 300K 0.001 Pa·s or more and 1000 Pa·s or less.

15. The method according to claim 10, wherein said stirring is carried out by any one or combinations of ultrasound, bubbling, a stirrer, a liquid delivery pump, a mill, a bead mill, a homogenizer, a wet jet mill, and a microwave.

16. The light conversion element according to claim 1, wherein an anion in said ionic liquid is one or more selected from the group consisting of $[N(SO_2CF_3)_2]^-$, $[C(SO_2CF_3)_3]^-$, $[PF_6]^-$, $[(C_2F_5)_3PF_3]^-$, and $[BR_1R_2R_3R_4]^-$ ($R_1$, $R_2$, $R_3$, and $R_4$ are independently $CH_3(CH_2)_n$ (wherein, n=1, 2, 3, 4, 5, 6, 7, 8, and 9) or aryl), and
    wherein a cation in said ionic liquid is one or more selected from the group consisting of an imidazolium cation, a pyridinium cation, a piperidinium cation, a pyrrolidinium cation, a pyrazolium cation, a thiazolium cation, a quaternary ammonium cation, a quaternary phosphonium cation, and a sulfonium cation.

17. The method according to claim 10, wherein an anion in said ionic liquid is one or more selected from the group consisting of $[N(SO_2CF_3)_2]^-$, $[C(SO_2CF_3)_3]^-$, $[PF_6]^-$, $[(C_2F_5)_3PF_3]^-$, and $[BR_1R_2R_3R_4]^-$ ($R_1$, $R_2$, $R_3$, and $R_4$ are independently $CH_3(CH_2)_n$ (wherein, n=1, 2, 3, 4, 5, 6, 7, 8, and 9) or aryl), and
    wherein a cation in said ionic liquid is one or more selected from the group consisting of an imidazolium cation, a pyridinium cation, a piperidinium cation, a pyrrolidinium cation, a pyrazolium cation, a thiazolium cation, a quaternary ammonium cation, a quaternary phosphonium cation, and a sulfonium cation.

* * * * *